(12) United States Patent
Aoyama et al.

(10) Patent No.: US 8,934,262 B2
(45) Date of Patent: Jan. 13, 2015

(54) WIRING BOARD AND METHOD FOR MANUFACTURING THE SAME

(75) Inventors: Masakazu Aoyama, Ogaki (JP); Hidetoshi Noguchi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 13/239,707

(22) Filed: Sep. 22, 2011

(65) Prior Publication Data

US 2012/0008296 A1 Jan. 12, 2012

Related U.S. Application Data

(63) Continuation of application No. 12/694,660, filed on Jan. 27, 2010.

(60) Provisional application No. 61/228,286, filed on Jul. 24, 2009.

(51) Int. Cl.
*H05K 1/11* (2006.01)
*H05K 3/46* (2006.01)
*H05K 1/14* (2006.01)
*H05K 1/03* (2006.01)
*H05K 1/18* (2006.01)

(52) U.S. Cl.
CPC .............. *H05K 1/142* (2013.01); *H05K 3/4694* (2013.01); *H05K 1/185* (2013.01); *H05K 3/4602* (2013.01); *H05K 2201/09145* (2013.01)
USPC ............ 361/795; 361/784; 361/792; 174/255

(58) Field of Classification Search
CPC ..... H05K 3/3447; H05K 3/281; H05K 3/326; H05K 7/06; H05K 2203/063
USPC .......... 174/260, 267, 262, 255; 361/792, 760, 361/784, 790, 794, 795, 793
See application file for complete search history.

(56) References Cited

U.S. PATENT DOCUMENTS 5,081,563 A * 1/1992 Feng et al. .................... 361/795
(Continued)

FOREIGN PATENT DOCUMENTS

| JP | 2001-053443 | 2/2001 |
| JP | 2003-298234 | 10/2003 |
| JP | 2004-039868 | 2/2004 |

(Continued)

OTHER PUBLICATIONS

U.S. Appl. No. 13/239,733, filed Sep. 22, 2011, Aoyama, et al.

*Primary Examiner* — Hoa C Nguyen
*Assistant Examiner* — Binh Tran
(74) *Attorney, Agent, or Firm* — Oblon, Spivak, McClelland, Maier & Neustadt, L.L.P.

(57) ABSTRACT

A wiring board including a first rigid wiring board having an accommodation portion and a conductor, a second rigid wiring board accommodated in the accommodation portion of the first rigid wiring board and having a conductor electrically connected to the conductor of the first rigid wiring board, and an insulation layer formed on the first rigid wiring board and the second rigid wiring board. The accommodation portion of the first rigid wiring board has wall surfaces tapering from a first surface of the first rigid wiring board to a second surface on the opposite side of the first surface, and the second rigid wiring board has side surfaces tapering such that the side surfaces of the second rigid wiring board substantially fit into the wall surfaces of the accommodation portion of the first rigid wiring board.

16 Claims, 27 Drawing Sheets

(56) References Cited

U.S. PATENT DOCUMENTS

| | | | |
|---|---|---|---|
| 6,098,278 A * | 8/2000 | Vindasius et al. | 29/830 |
| 7,580,240 B2 * | 8/2009 | Yamamoto et al. | 361/311 |
| 7,626,829 B2 | 12/2009 | Watanabe et al. | |
| 8,079,142 B2 * | 12/2011 | Sakamoto et al. | 29/852 |
| 2002/0020554 A1 * | 2/2002 | Sakamoto et al. | 174/261 |
| 2009/0283312 A1 | 11/2009 | Takahashi | |
| 2009/0290318 A1 * | 11/2009 | Takahashi | 361/792 |
| 2010/0000087 A1 | 1/2010 | Watanabe et al. | |
| 2011/0100680 A1 | 5/2011 | Naganuma | |
| 2011/0100698 A1 | 5/2011 | Naganuma | |

FOREIGN PATENT DOCUMENTS

| | | |
|---|---|---|
| JP | 2005-191027 | 7/2005 |
| JP | 2005-340416 | 12/2005 |
| JP | 2006-108382 | 4/2006 |
| JP | 2007-294634 | 11/2007 |
| JP | 2007-305931 | 11/2007 |
| JP | 2008-300658 | 12/2008 |
| JP | 2009-105345 | 5/2009 |
| JP | 2009-105362 | 5/2009 |
| TW | 200847363 | 12/2008 |
| WO | WO 2011/003123 A1 | 1/2011 |

* cited by examiner

| Sample | Reinforcing Pattern | External Configuration |
|--------|---------------------|------------------------|
| #1 | No | straight |
| #2 | No | zigzag |
| #3 | Yes | straight |
| #4 | Yes | zigzag |

FIG.6

| Sample | Durability (number of times dropped) |
|---|---|
| #1 | 3 |
| | 4 |
| | 7 |
| #2~#4 | 200 times and above |
| | 200 times and above |
| | 200 times and above |

FIG.8

WIRING BOARD AND METHOD FOR MANUFACTURING THE SAME

CROSS-REFERENCE TO RELATED APPLICATIONS

The present application is a continuation of and claims the benefit of priority under 35 U.S.C. §120 from U.S. Ser. No. 12/694,660, filed Jan. 27, 2010, which is based upon and claims the benefit of priority from U.S. Application No. 61/228,286, filed Jul. 24, 2009. The contents of those applications are incorporated herein by reference in their entirety.

BACKGROUND OF THE INVENTION

1. Field of the Invention

The present invention relates to a wiring board and its manufacturing method.

2. Discussion of the Background

In Japanese Laid-Open Patent Publication 2003-298234, a wiring board is described which is formed with a first wiring board having a first wiring layer on a first insulative substrate and with a second wiring board having a second wiring layer on a second insulative substrate. In such a wiring board, the second wiring board is laminated on the first wiring board, and the first wiring layer and the second wiring layer are electrically connected to each other.

In Japanese Laid-Open Patent Publication 2008-300658, a flexible-rigid wiring board is described where a flexible insulative material and a rigid insulative material are adhered while being parallel to each other, and an end portion of the flexible insulative material facing the rigid insulative material has a concave-convex portion.

The contents of Japanese Laid-Open Patent Publication Nos. 2003-298234 and 2008-300658 are incorporated herein by reference in their entirety.

SUMMARY OF THE INVENTION

A wiring board according to one aspect of the present invention is formed with a first rigid wiring board having an accommodation section, a second rigid wiring board accommodated in the accommodation section, and an insulation layer formed on the first rigid wiring board and the second rigid wiring board. In such a wiring board, a conductor of the first rigid wiring board and a conductor of the second rigid wiring board are electrically connected to each other, and at least either a side surface of the second rigid wiring board or a wall surface of the accommodation section has a concave-convex portion.

A method for manufacturing a wiring board according to another aspect of the present invention includes manufacturing a first rigid wiring board having an accommodation section; manufacturing a second rigid wiring board whose side surface has a concave-convex portion; accommodating the second rigid wiring board in the accommodation section; forming an insulation layer to be formed on the first rigid wiring board and the second rigid wiring board; and electrically connecting a conductor of the first rigid wiring board and a conductor of the second rigid wiring board to each other.

A method for manufacturing a wiring board according to yet another aspect of the present invention includes manufacturing a first rigid wiring board having an accommodation section whose wall surface has a concave-convex portion; manufacturing a second rigid wiring board; accommodating the second rigid wiring board in the accommodation section; forming an insulation layer to be formed on the first rigid wiring board and the second rigid wiring board; and electrically connecting a conductor of the first rigid wiring board and a conductor of the second rigid wiring board to each other.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6 is a table showing samples to be used in a drop test and a bend test;

FIG. 8 is a table showing the results of the drop test;

DETAILED DESCRIPTION OF THE EMBODIMENTS

Figure 1:
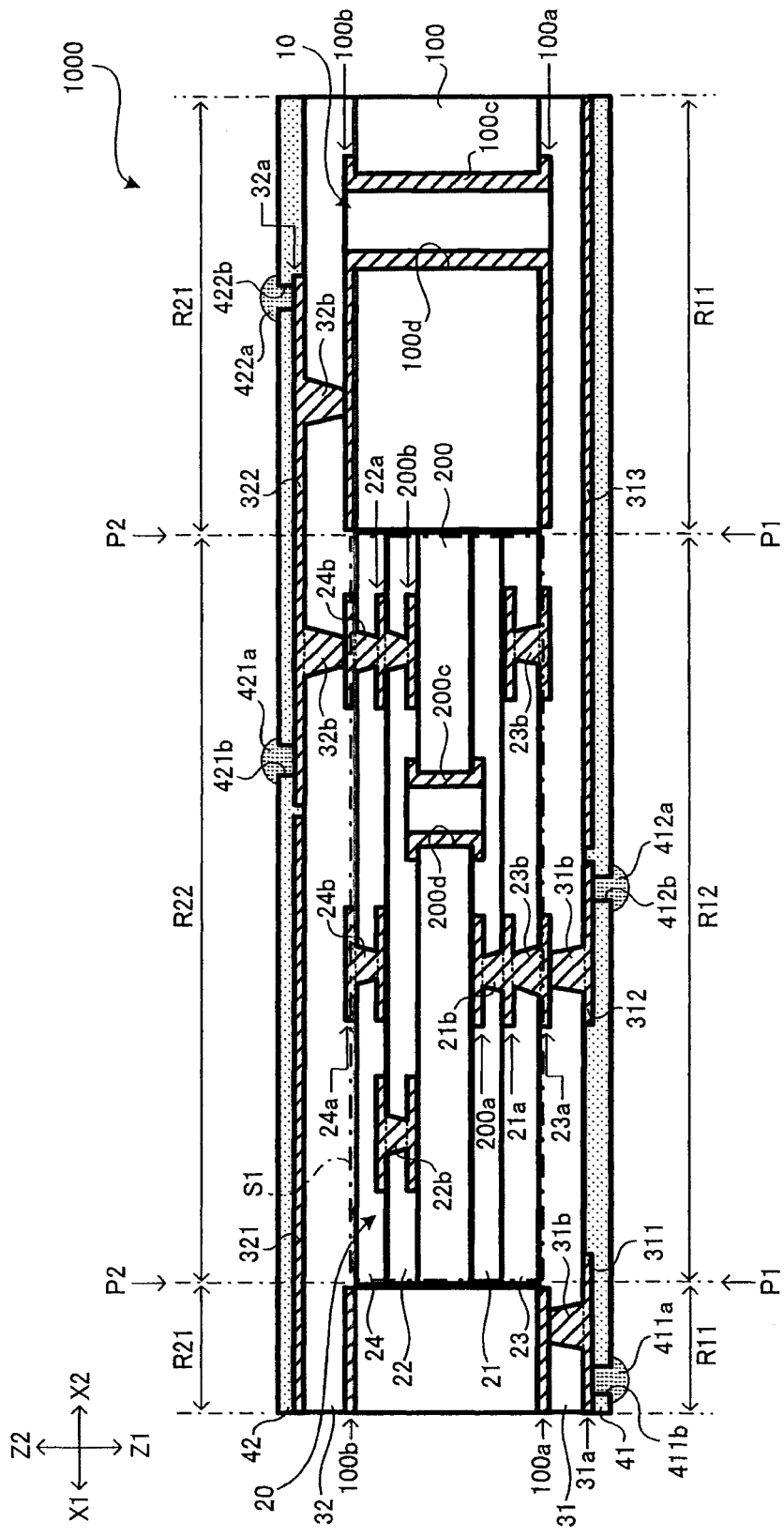
FIG. 1 is a cross-sectional view of a wiring board according to an embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction of a wiring board corresponding to a direction along a normal line (or a direction of the thickness of a core substrate) to the main surfaces (upper and lower surfaces) of the wiring board. "Directly on" indicates a lamination direction. On the other hand, arrows (X1, X2) and (Y1, Y2) each indicate a direction perpendicular to a lamination direction (a direction parallel to the main surfaces of a wiring board). The main surfaces of a wiring board are on the X-Y plane. In addition, the side surfaces of a wiring board are on the X-Z plane or the Y-Z plane.

In the present embodiment, two main surfaces of a wiring board are referred to as a first surface (the surface on the arrow-Z1 side) and a second surface (the surface on the arrow-Z2 side). In a lamination direction, a side closer to the core (substrates 100, 200) is referred to as a lower layer, and a side farther from the core is referred to as an upper layer. A layer including a conductive pattern that functions as wiring is referred to as a wiring layer. A conductor formed on the wall surface of a through-hole is referred to as a through-hole conductor. Also, a conductor which is formed in a via hole and electrically connects the upper wiring layer and the lower wiring layer to each other is referred to as an interlayer connection conductor.

As shown in FIG. 1, wiring board 1000 according to the present embodiment has first rigid wiring board 10, second rigid wiring board 20, insulation layers (31, 32), wiring layers (31a, 32a), solder-resist layers (41, 42) and external connection terminals (411a, 412a, 421a, 422a). Second rigid wiring board 20 is accommodated in accommodation section (S1) formed in first rigid wiring board 10. Accommodation section (S1) of the present embodiment is formed as a penetrating hole. Each of wiring board 1000, first rigid wiring board 10 and second rigid wiring board 20 is a rigid printed wiring board.

Figure 2:
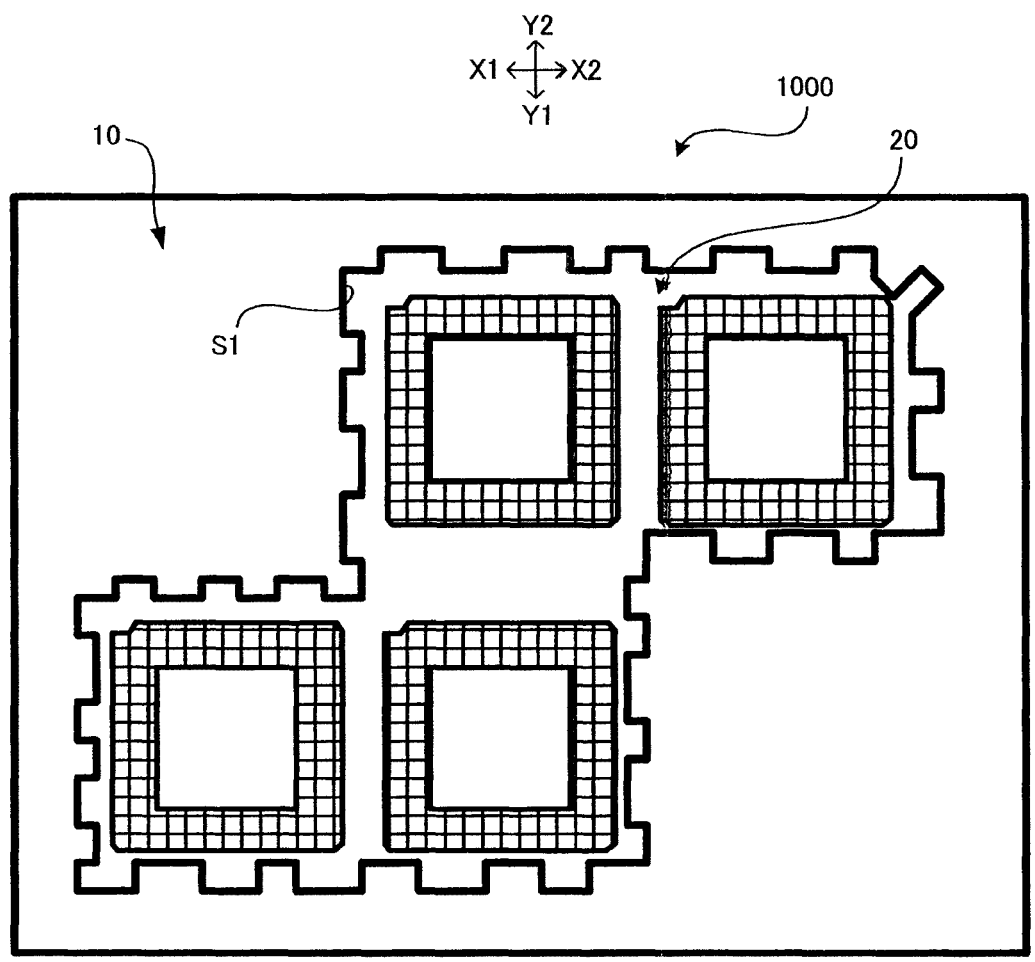
FIG. 2 is a plan view of a wiring board according to the embodiment of the present invention.

The side surfaces of second rigid wiring board 20 have concave-convex portions as shown in FIG. 2 (plan view). More specifically, the entire circumference of the side surfaces of second rigid wiring board 20 is shaped zigzag. Also, the wall-surface configuration of accommodation section (S1) facing the side surface of second rigid wiring board 20 is shaped zigzag corresponding to the side-surface configuration of second rigid wiring board 20. Namely, a convex portion faces a concave portion, and a concave portion faces a convex portion. Thus, the outer circumference of accommodation section (S1) substantially matches the external configuration of second rigid wiring board 20. In the present embodiment, second rigid wiring board 20 fits with accommodation section (S1). A zigzag configuration indicates that concave portions and convex portions alternate in a series. The numbers of concave portions and convex portions are not limited specifically, and a concave-convex cycle may be constant or irregular.

Figure 3A:
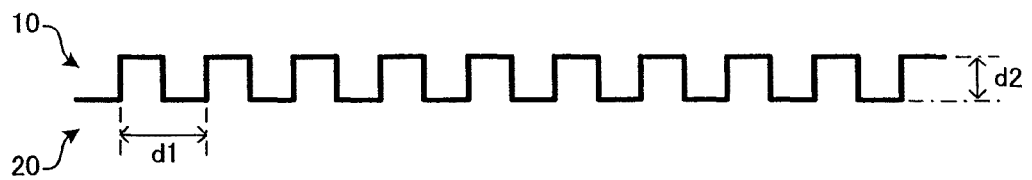
FIG. 3A is a view showing a first configuration of a side surface of a second rigid wiring board and a wall surface of an accommodation section.
Figure 3B:
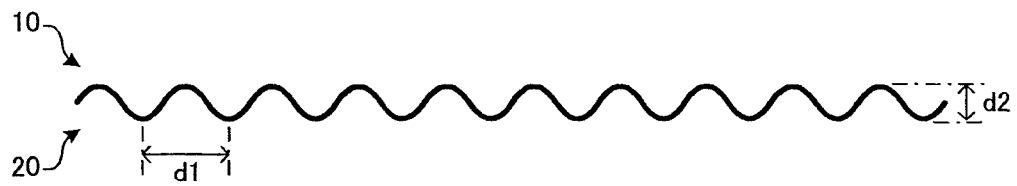
FIG. 3B is a view showing a second configuration of a side surface of a second rigid wiring board and a wall surface of an accommodation section.
Figure 3C:
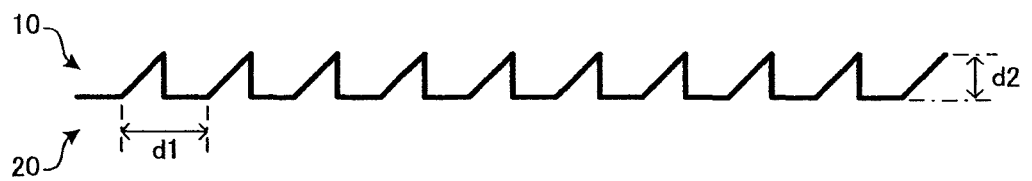
FIG. 3C is a view showing a third configuration of a side surface of a second rigid wiring board and a wall surface of an accommodation section.

The cycle of a zigzag configuration or the size of concave-convex portions may be irregular or constant. Also, the shape of concave-convex portions is not limited specifically. For example, as shown in FIG. 3A, the concave-convex line may be a line formed with a series of quadrilaterals (such as rectangular waves or trapezoidal waves). Alternatively, as shown in FIG. 3B, the concave-convex line may be a line formed with arcs (such as sine waves). Yet alternatively, as shown in FIG. 3C, the concave-convex line may be a line formed with a series of triangles (such as sawtooth waves). Concave-convex cycle (d1) is preferred to be, for example, 1.0 mm (the width of a concave and the width of a convex are each 0.5 mm, for example). Concave-convex amplitude (d2) is preferred to be 0.5 mm, for example.

Figure 4A:
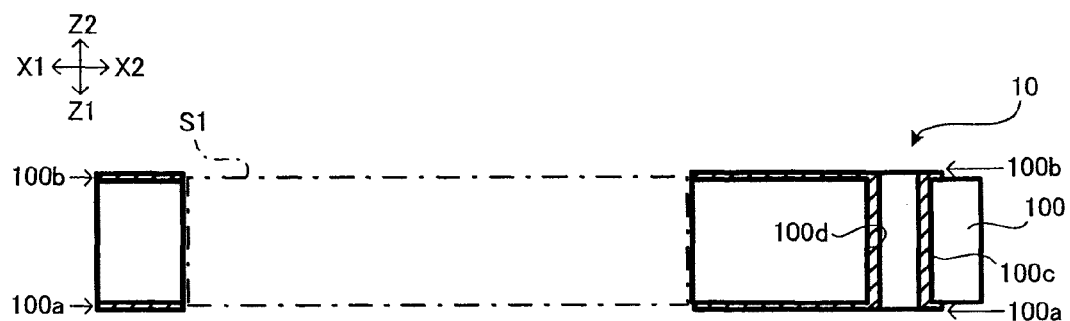
FIG. 4A is a cross-sectional view of a first rigid wiring board.
Figure 4B:
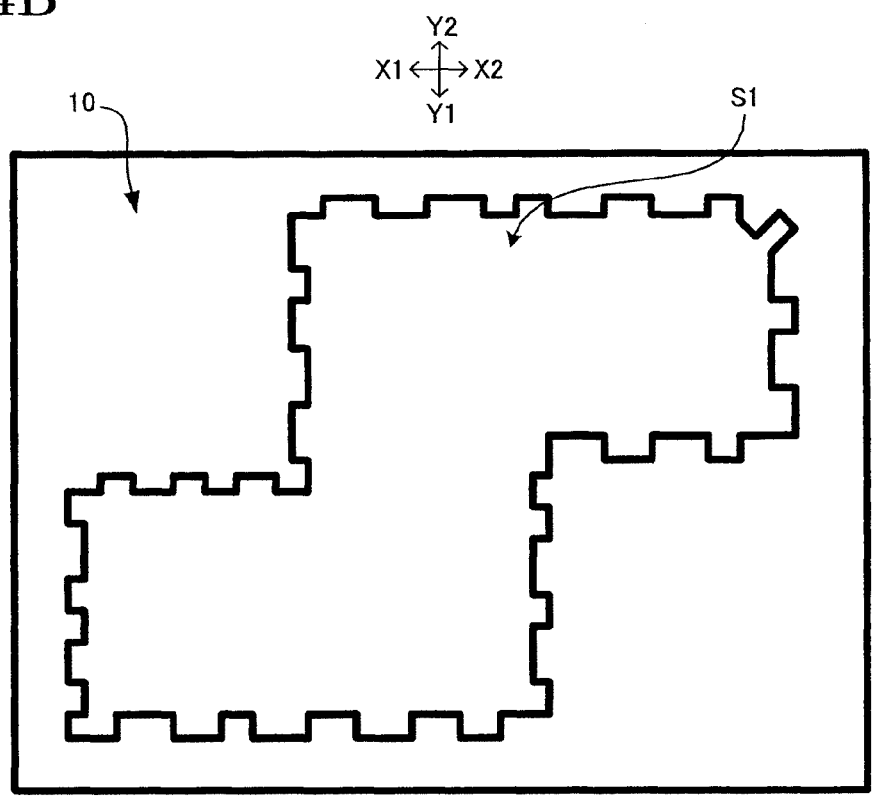
FIG. 4B is a plan view of a first rigid wiring board.

As shown in FIG. 4A (cross-sectional view) and FIG. 4B (plan view), first rigid wiring board 10 has substrate 100 to become a core, and wiring layers (100a, 100b). Approximate external dimensions of first rigid wiring board 10 are, for example, width in the X direction 100 mm and width in the Y direction 50 mm.

Substrate 100 is made of epoxy resin, for example. Epoxy resin is preferred to include a reinforcing material such as glass fabric or aramid fabric, which is then impregnated with resin, for example. Reinforcing materials have smaller thermal expansion coefficients than a primary material (epoxy resin). As for a reinforcing material, inorganic materials are preferred.

On their respective main surfaces of substrate 100, wiring layers (100a, 100b) made of copper, for example, are formed. Also, through-hole (100d) is formed in substrate 100. Through-hole conductor (100c) is formed in through-hole (100d) by plating copper, for example. Through-hole conductor (100c) electrically connects wiring layer (100a) and wiring layer (100b) to each other.

Figure 5A:
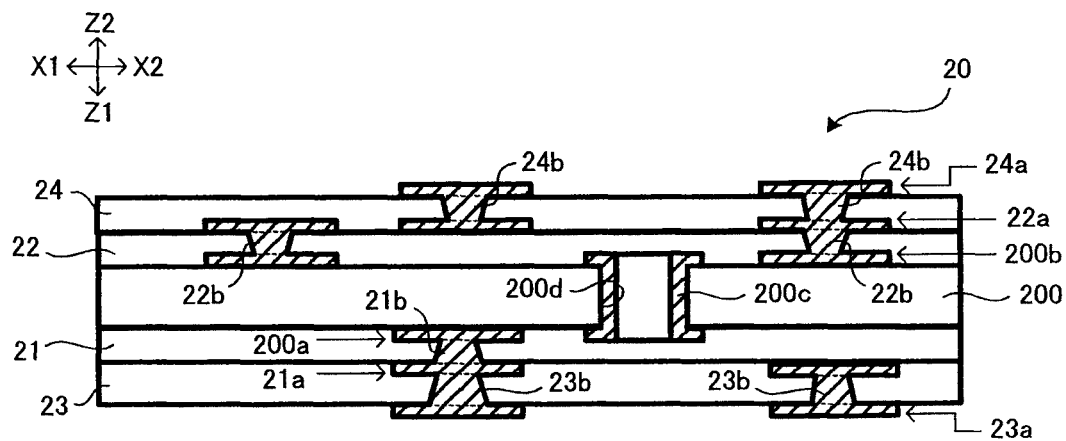
FIG. 5A is a cross-sectional view of a second rigid wiring board.
Figure 5B:
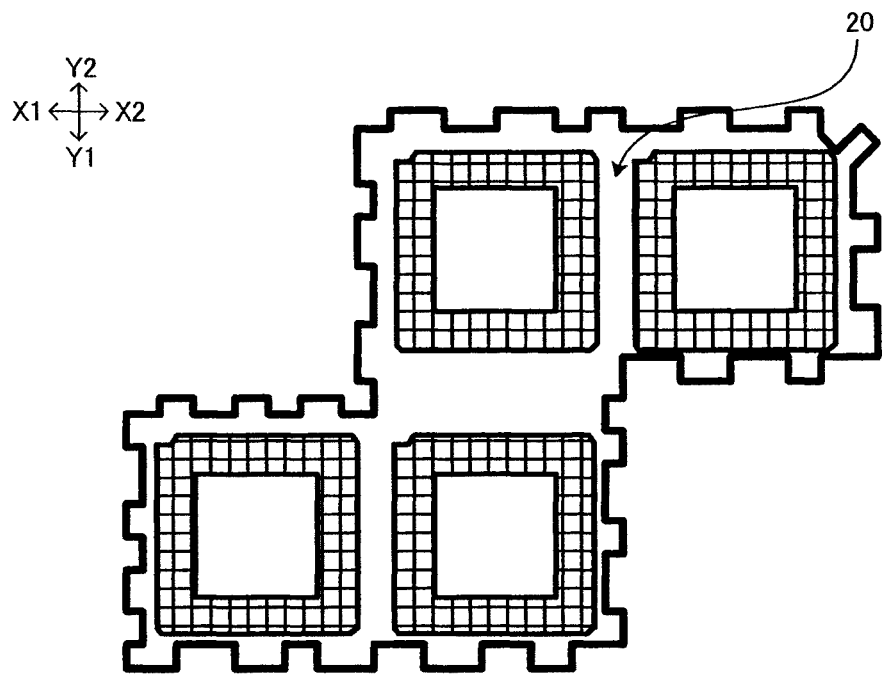
FIG. 5B is a plan view of a second rigid wiring board.

As in FIG. 5A (cross-sectional view) and FIG. 5B (plan view), second rigid wiring board 20 has substrate 200 to become a core, wiring layers (200a, 200b) and (21a-24a), insulation layers (21-24), and interlayer connection conductors (21b-24b). Second rigid wiring board 20 has smaller external dimensions than first rigid wiring board 10. Approximate external dimensions of second rigid wiring board 20 are, for example, width in the X direction 40 mm and width in the Y direction 30 mm.

Substrate 200 is made of epoxy resin, for example. The same as in substrate 100, the epoxy resin in substrate 200 is preferred to include a reinforcing material such as glass fabric or aramid fabric, which is then impregnated with resin, for example.

On their respective main surfaces of substrate 200, wiring layers (200a, 200b) made of copper, for example, are formed. Also, through-hole (200d) is formed in substrate 200. Through-hole conductor (200c) is formed in through-hole (200d) by plating copper, for example. Through-hole conductor (200c) electrically connects wiring layer (200a) and wiring layer (200b) to each other.

Insulation layers (21, 22) are formed on their respective main surfaces of substrate 200. Wiring layer (21a) is formed on insulation layer 21, and wiring layer (22a) is formed on insulation layer 22. Wiring layer (200a) and wiring layer (21a) are electrically connected to each other by means of interlayer connection conductor (21b) formed in insulation layer 21. Wiring layer (200b) and wiring layer (22a) are electrically connected to each other by means of interlayer connection conductor (22b) formed in insulation layer 22.

Insulation layer 23 is formed on insulation layer 21, and insulation layer 24 is formed on insulation layer 22. Wiring layer (23a) is formed on insulation layer 23, and wiring layer (24a) is formed on insulation layer 24. Wiring layer (21a) and wiring layer (23a) are electrically connected to each other by means of interlayer connection conductor (23b) formed in insulation layer 23. Wiring layer (22a) and wiring layer (24a) are electrically connected to each other by means of interlayer connection conductor (24b) formed in insulation layer 24.

Wiring layers (21a-24a) and interlayer connection conductors (21b-24b) are made of plated-copper film, for example. Also, insulation layers (21-24) are made of cured prepreg, for example. As for such a prepreg, for example, the following is used: base materials such as glass fabric or aramid fabric are impregnated with resins such as epoxy resin, polyester resin, bismaleimide triazine resin (BT resin), imide resin (polyimide), phenol resin, or allyl polyphenylene ether resin (A-PPE resin).

Configurations and materials for wiring layers (21a-24a), interlayer connection conductors (21b-24b) and insulation layers (21-24) are not limited to those described above, and they may be modified according to requirements or the like. For example, as the material for wiring layers (21a-24a) and interlayer connection conductors (21b-24b), metals other than copper may also be used. As the material for insulation layers (21-24), liquid or film-type thermosetting resins or thermoplastic resins or even RCF (resin coated copper foil) may also be used instead of prepreg. Here, as for thermosetting resins, for example, epoxy resin, imide resin (polyimide), BT resin, allyl polyphenylene ether resin, aramid resin or the like may be used. Also, as for thermoplastic resins, for example, liquid crystal polymer (LCP), PEEK resin, PTFE resin (fluororesin) or the like may be used. Such materials are preferred to be selected from the viewpoint of insulation, dielectric properties, heat resistance, mechanical features or the like. In addition, additives such as hardening agents, stabilizers, fillers or the like may be contained in the above resins. Also, wiring layers (21a-24a) and insulation layers (21-24) may be formed with multiple layers (composite layers) made of different materials.

Interlayer connection conductors (21b-24b) of the present embodiment are filled vias in which conductor is filled in via holes. However, interlayer connection conductors (21b-24b) are not limited to such, and they may be conformal vias in which conductor is formed on the wall surfaces of via holes.

First rigid wiring board 10 and second rigid wiring board 20 have substantially the same thickness as each other. Also, as described above, first rigid wiring board 10 has two wiring layers (100a, 100b), and second rigid wiring board 20 has six wiring layers (200a, 200b, 21a-24a). Thus, the number of wiring layers included in the same thickness is greater in second rigid wiring board 20 than in first rigid wiring board 10. The approximate thickness of first rigid wiring board 10 and second rigid wiring board 20 is, for example, 560 μm, including the conductive patterns on both of their surfaces.

As shown in FIG. 1 (cross-sectional view) and FIG. 2 (plan view), second rigid wiring board 20 is accommodated in accommodation section (S1) formed in first rigid wiring board 10. Second rigid wiring board 20 is fit into accommodation section (S1). On the first surface and second surface of first rigid wiring board 10 and second rigid wiring board 20, insulation layers (31, 32) are laminated. Insulation layer 31 or 32 is formed either on the first surface or the second surface of first rigid wiring board 10 and second rigid wiring board 20. "Accommodated in the accommodation section" includes cases in which the entire second rigid wiring board is arranged completely in the accommodation section, as well as cases in which only part of the second rigid wiring board is arranged in the accommodation section. In short, it is sufficient if at least part of the second rigid wiring board is arranged in the accommodation section.

Wiring layer (31a) is formed on insulation layer 31, and wiring layer (32a) is formed on insulation layer 32. Wiring layer (23a) and wiring layer (31a) are electrically connected to each other by means of interlayer connection conductor (31b) formed in insulation layer 31. Wiring layer (24a) and wiring layer (32a) are electrically connected to each other by means of interlayer connection conductor (32b) formed in insulation layer 32. In wiring layer (31a), conductive patterns (311-313) are included, and in wiring layer (32a), conductive patterns (321-322) are included.

Conductive pattern 322 is electrically connected to wiring layer (100b) of first rigid wiring board 10 and to wiring layer (24a) of second rigid wiring board 20. Accordingly, wiring layer (100b) (conductor) of first rigid wiring board 10 and wiring layer (24a) (conductor) of second rigid wiring board 20 are electrically connected to each other by means of via holes formed in insulation layer 32.

Solder-resist layer 41 having opening portions (411b, 412b) is formed on insulation layer 31. Also, solder-resist layer 42 having opening portions (421b, 422b) is formed on insulation layer 32. Here, solder-resist layers (41, 42) are each made of, for example, photosensitive resin using acrylic-epoxy resin, thermosetting resin mainly containing epoxy resin, UV-curing resin or the like.

Opening portion (411b) is arranged directly on region (R11) in first rigid wiring board 10 on the first-surface side.

Opening portion (412b) is arranged directly on region (R12) in second rigid wiring board 20 on the first-surface side. Opening portion (421b) is arranged directly on region (R22) in second rigid wiring board 20 on the second-surface side. Opening portion (422b) is arranged directly on region (R21) in first rigid wiring board 10 on the second-surface side.

In opening portions (411b, 412b, 421b, 422b), external connection terminals (411a, 412a, 421a, 422a) made of solder, for example, are formed. External connection terminal (411a) is electrically connected to conductive pattern 311. External connection terminal (412a) is electrically connected to conductive pattern 312. External connection terminals (421a, 422a) are electrically connected to conductive pattern 322. External connection terminals (411a, 412a, 421a, 422a) are used for electrical connections, for example, with other wiring boards or electronic components. Wiring board 1000 may be used, for example, as a circuit substrate for cell phones or the like by being mounted on other wiring boards using one or both of its surfaces.

On substantially the entire circumferences of (P1, P2) directly on the boundaries between the wall surfaces of accommodation section (S1) and the side surfaces of second rigid wiring board 20, reinforcing patterns made of metal film are formed. In the present embodiment, conductive pattern 311 or 313 is formed in (P1) directly on the border portions on the first-surface side in FIG. 1. Also, conductive pattern 321 or 322 is formed in (P2) directly on the border portions on the second-surface side. Here, conductive patterns (311, 322) are used as the wiring for first rigid wiring board 10 or second rigid wiring board 20. On the other hand, conductive patterns (313, 321) are solid patterns which are insulated from the wiring of first rigid wiring board 10 and second rigid wiring board 20. Such solid patterns are connected to ground, for example.

In the following, characteristics of wiring board 1000 are described. The inventors conducted drop tests and bend tests on each of wiring board 1000 and comparative examples.

Figure 7:
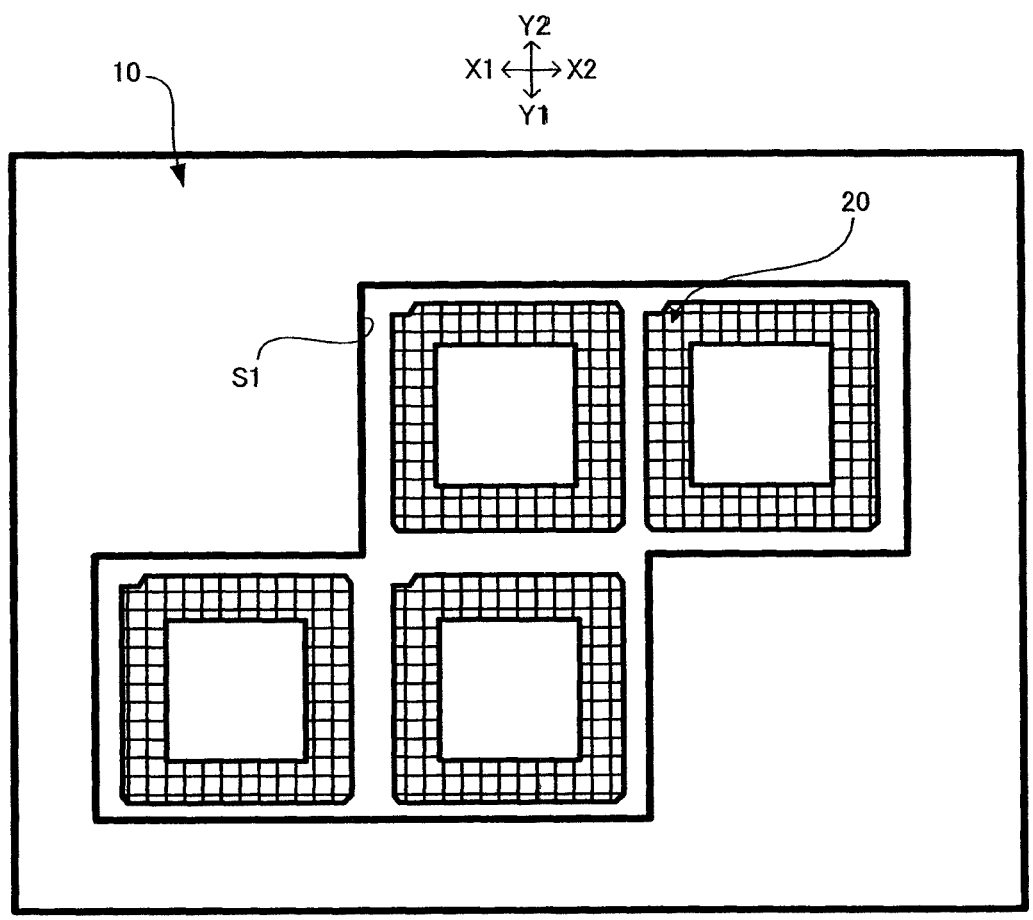
FIG. 7 is a view showing a sample wiring board having a straight configuration.

Such tests were conducted on samples (#1-#4) shown in FIG. 6. Sample #1 is a wiring board with a straight configuration and does not have reinforcing patterns. Sample #2 is a wiring board with a zigzag configuration and does not have reinforcing patterns. Sample #3 is a wiring board with a straight configuration and has reinforcing patterns. Sample #4 is wiring board 1000 of the present embodiment (FIGS. 1, 2). Namely, sample #4 is a wiring board with a zigzag configuration and has reinforcing patterns. Here, a wiring board with a straight configuration indicates a wiring board such as shown in FIG. 7. A straight configuration or a zigzag configuration indicates the configuration of the side surfaces of second rigid wiring board 20 and the wall surfaces of accommodation section (S1) (see FIGS. 2, 7). Reinforcing patterns are formed directly on the boundary portions between the wall surfaces of accommodation section (S1) and the side surfaces of second rigid wiring board 20 (for example, conductive pattern 321 or the like shown in FIG. 1).

The zigzag configurations in samples (#2, #4) are rectangular waves with constant cycle (d1) as shown in FIG. 3A previously. The width of the concave and the width of the convex are each half the cycle.

Drop tests were conducted on samples (#1-#4). More specifically, the samples were dropped repeatedly, and the number of times dropped was counted until the samples broke. Such tests were conducted three times each on samples (#1-#4). The width and amplitude (d2) (FIG. 3A) of the concave and convex in the zigzag configuration of samples (#2, #4) used in the tests are 0.5 mm (cycle (d1)=1.0 mm).

FIG. 8 shows the results of the drop tests. The test results of sample (#1) are three times, four times and seven times; the sample broke at an early stage in each of the three tests. The test results of samples (#2-#4) show that none broke even after the number of times being dropped exceeded 200. From the test results, it is assumed that zigzag configurations and reinforcing patterns enhance the durability of wiring boards.

Figure 9:
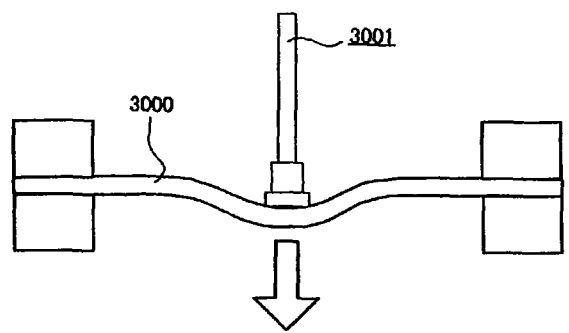
FIG. 9 is a view to illustrate a bend test.

Bend tests were conducted on samples (#1-#4). More specifically, as shown in FIG. 9, using three-point bending apparatus 3001 under the condition that both ends of wiring board 3000 (sample #1-#4) were fixed, pressure exerted on the central portion of wiring board 3000 increased until wiring board 3000 broke. Then, the intensity of the pressure when the wiring board broke was measured. The width and amplitude (d2) (FIG. 3A) of the concave and convex in the zigzag configuration of samples (#2, #4) used in the tests are 0.5 mm (cycle (d1)=1.0 mm), 1.0 mm (cycle (d1)=2.0 mm) and 1.5 mm (cycle (d1)=3 mm).

Figure 10:
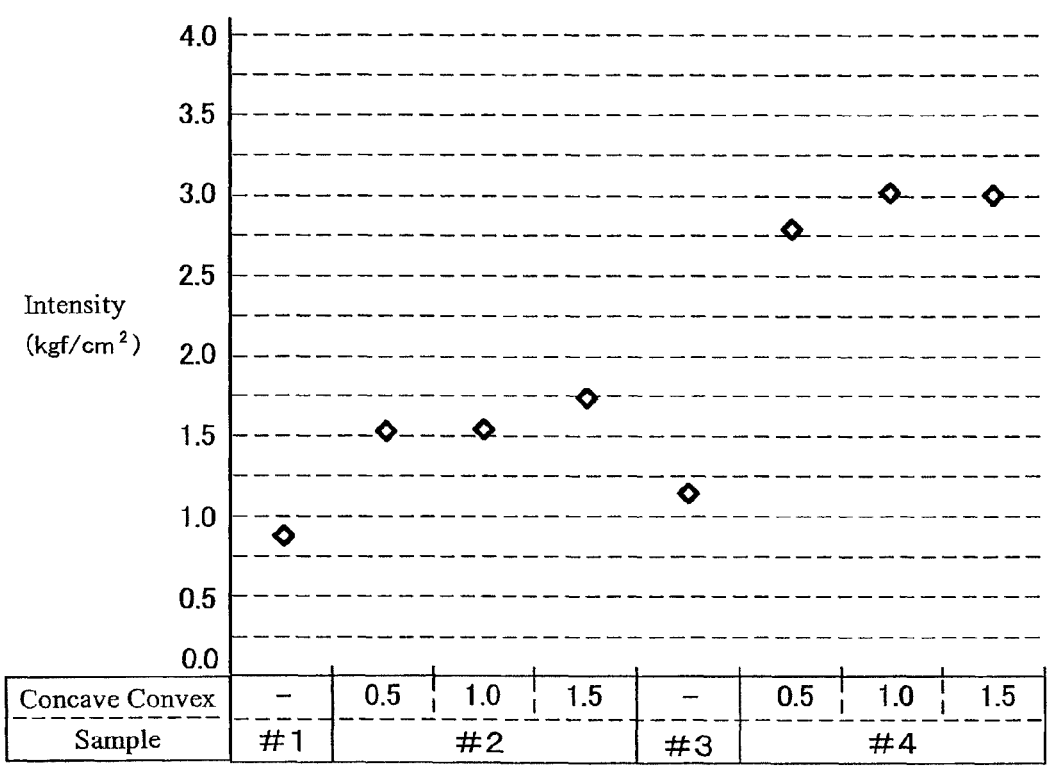
FIG. 10 is a graph showing the results of the bend test.

FIG. 10 shows the results of the bend tests. Sample #2 was less likely to break than sample #1, and sample #4 was less likely to break than sample #3. From such test results, it is assumed that zigzag configurations enhance the durability of wiring boards. Also, sample #3 was less likely to break than sample #1, and sample #4 was less likely to break than sample #2. From such test results, it is assumed that reinforcing patterns enhance the durability of wiring boards.

Furthermore, from the results of samples (#2, #4), it can be inferred that the greater the width and amplitude (d2) of the concave and convex, the greater the durability of the wiring boards. However, it is also assumed that durability may not improve notably if the width and amplitude (d2) of the concave and convex are set greater than 0.5 mm. If the width and amplitude (d2) of the concave and convex are set greater than that, spaces for mounting components or forming circuits will become narrower in first rigid wiring board 10 or second rigid wiring board 20. Thus, the width and amplitude (d2) of the concave and convex are preferred to be set at 0.5 mm.

As described above, durability may be enhanced in wiring board 1000 of the present embodiment. The reasons are assumed to be the following: By forming the side surfaces of second rigid wiring board 20 and the wall surfaces of accommodation section (S1) in a zigzag configuration, the contact areas in first rigid wiring board 10 and second rigid wiring board 20 will increase, thus suppressing cracks. In addition, since the portions peeled off by cracks may cause failure by protruding onto the surfaces of a wiring board, suppressing cracks will improve productivity.

Since flexible materials are not used in wiring board 1000 of the present embodiment, first rigid wiring board 10 and second rigid wiring board 20 may be coated with insulation layers (31, 32). Accordingly, the durability of wiring board 1000 may be further improved.

Wiring boards (first rigid wiring board 10 and second rigid wiring board 20) to be assembled in wiring board 1000 of the present invention are both rigid wiring boards. Thus, when second rigid wiring board 20 is accommodated in accommodation section (S1), second rigid wiring board 20 may be fixed by friction forces.

In wiring board 1000 of the present invention, since second rigid wiring board 20 with a greater number of wiring layers than first rigid wiring board 10 is accommodated in accommodation section (S1), the conductor density of wiring board 1000 may be increased partially (making higher-density wiring).

When manufacturing wiring board 1000 of the present invention, first rigid wiring board 10 and second rigid wiring board 20 are each manufactured first.

Figure 11A:
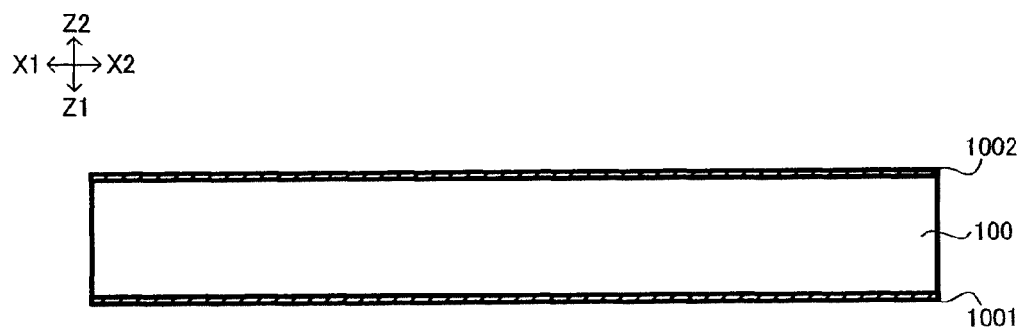
FIG. 11A is a view to illustrate a first step for forming a wiring layer of the first rigid wiring board.
Figure 11B:
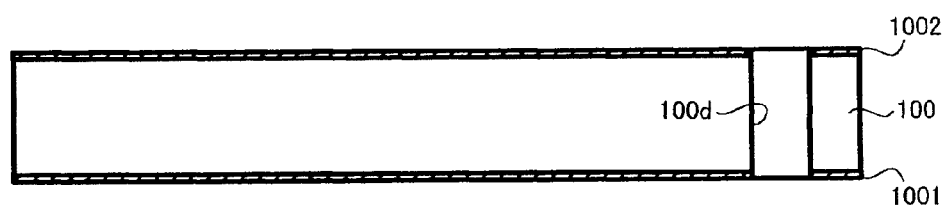
FIG. 11B is a view to illustrate a second step for forming a wiring layer of the first rigid wiring board.
Figure 11C:
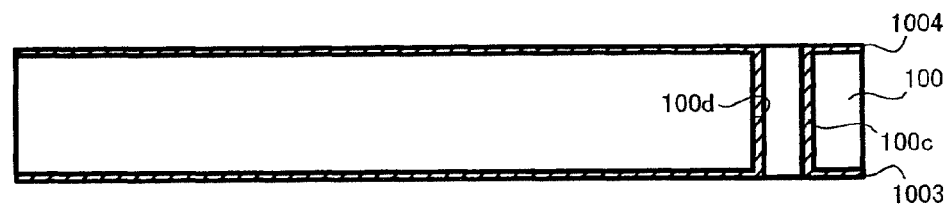
FIG. 11C is a view to illustrate a third step for forming a wiring layer of the first rigid wiring board.
Figure 11D:
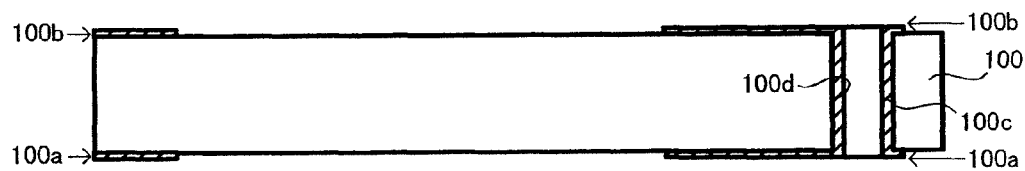
FIG. 11D is a view to illustrate a fourth step for forming a wiring layer of the first rigid wiring board.

When manufacturing first rigid wiring board 10, substrate 1000 having copper foils (1001, 1002) on the first surface and the second surface is prepared, as shown in FIG. 11A, for example. As for such starting material, copper-clad laminate may be used, for example. As shown in FIG. 11B, through-hole (100d) is formed using a drill or a laser, for example. PN plating (such as chemical copper-plating and copper electroplating) is performed. Accordingly, as shown in FIG. 11C, conductive films (1003, 1004) are formed on the first surface and the second surface of substrate 100, and through-hole conductor (100c) is formed on the wall surface of through-hole (100d). Conductive films (1003, 1004) are composite films made by laminating copper foil and copper-plated coating. Conductive films (1003, 1004) are patterned by predetermined photo-etching procedures (acid cleansing, resist lamination, exposure and development, etching, film removal and so forth), for example. Accordingly, as shown in FIG. 11D, wiring layers (100a, 100b) are formed.

Accommodation section (S1) is formed. During that time, the wall surfaces of accommodation section (S1) are shaped to be zigzag.

Figure 12A:
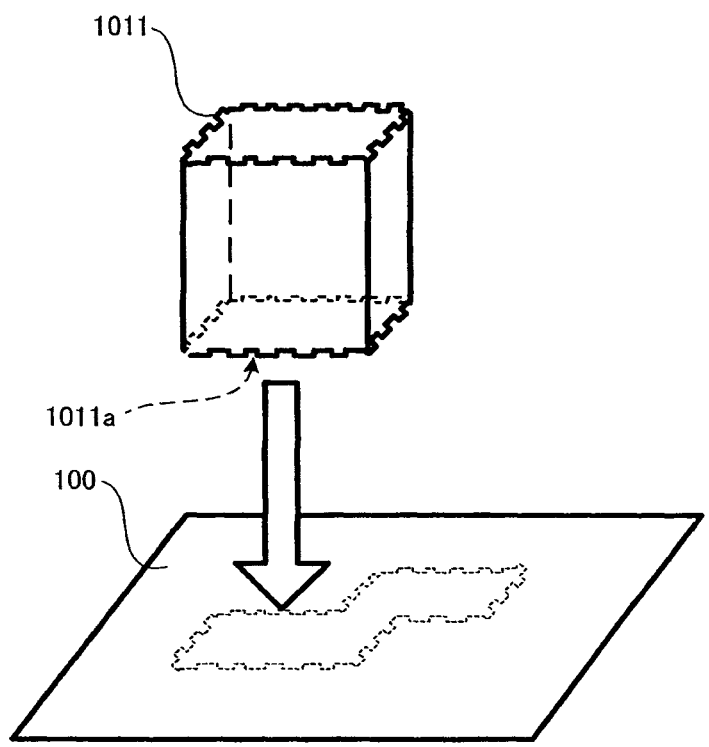
FIG. 12A is a view to illustrate a step for forming an accommodation section using a die.

As shown in FIG. 12A, for example, accommodation section (S1) is formed using quadrilateral cylinder-shaped die 1011. The shape of opening surface (1011a) of die 1011 is shaped to be zigzag to correspond to the configuration of accommodation section (S1). By pressurizing die 1011 twice, for example, accommodation section (S1) is formed in the substrate (FIG. 11D), corresponding to the shape of opening surface (1011a). The material of die 1011 is steel, for example. The approximate thickness of die 1011 is 30 mm, for example.

Figure 12B:
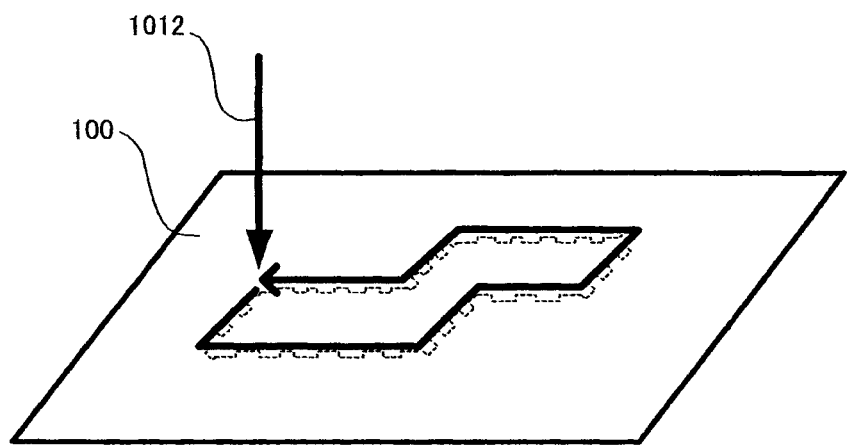
FIG. 12B is a view to illustrate a step for forming an accommodation section using a laser.

Alternatively, as shown in FIG. 12B, for example, accommodation section (S1) may be formed by laser 1012. Laser 1012 is scanned zigzag to correspond to the configuration of accommodation section (S1). By cutting out the predetermined portion of the substrate (FIG. 11D) using laser 1012, accommodation section (S1) shaped to be zigzag may be formed in the substrate.

Accommodation section (S1) is preferred to be formed by die 1011 or laser 1012, but other methods may be used. For example, accommodation section (S1) may be formed by a router.

When forming accommodation section (S1), alignment marks (for example, conductive patterns) which can be read by X-rays are arranged in the four corners of first rigid wiring board 10. Accommodation section (S1) is preferred to be formed at the predetermined position based on such alignment marks. Also, according to requirements, burrs on the cut surfaces may be removed.

Figure 13:
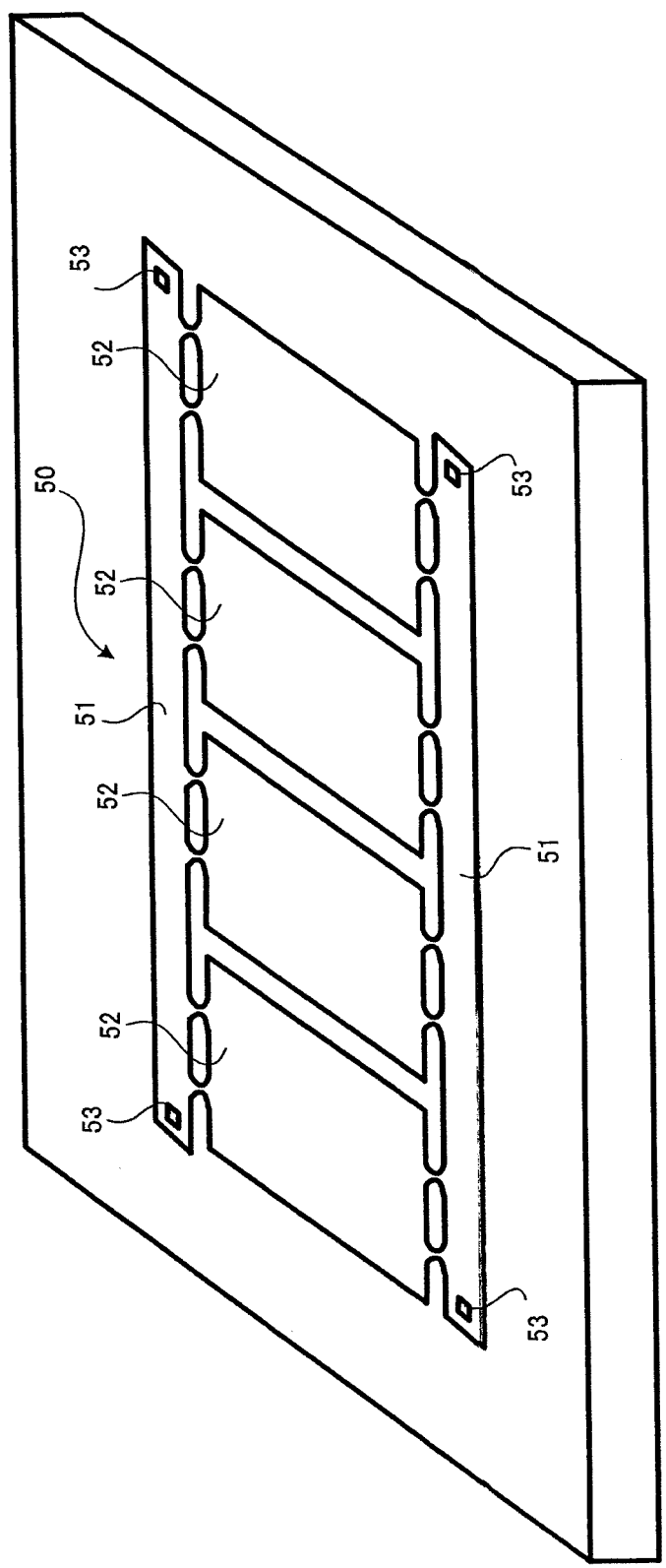
FIG. 13 is a view showing an example of a work-size wiring board which includes multiple wiring boards.

A work-size wiring board including multiple wiring boards may be used to manufacture multiple first rigid wiring boards 10 at one time. For example, as shown in FIG. 13, multi-piece substrate 50 in which multiple wiring boards 52 are fixed to frame 51 may be used. In such a case, accommodation section (S1) is preferred to be formed based on alignment marks 53 (for example, conductive patterns) arranged in four corners of multi-piece substrate 50. Accordingly, wiring boards 52 are each finished as first rigid wiring board 10.

Accommodation section (S1) is formed through the above steps, and first rigid wiring board 10 (FIGS. 4A, 4B) having conductors (wiring layers (100a) and others) is completed.

Figure 14A:
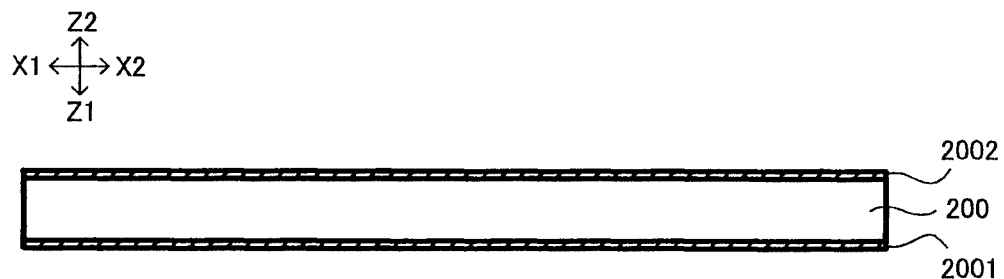
FIG. 14A is a view to illustrate a first step for forming a first wiring layer of the second rigid wiring board.
Figure 14B:
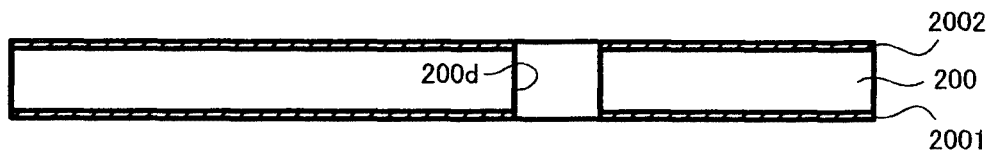
FIG. 14B is a view to illustrate a second step for forming a first wiring layer of the second rigid wiring board.
Figure 14C:
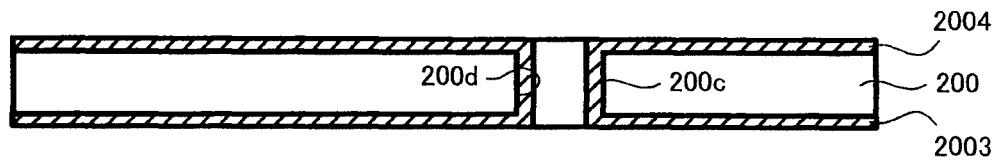
FIG. 14C is a view to illustrate a third step for forming a first wiring layer of the second rigid wiring board.

On the other hand, when manufacturing second rigid wiring board 20, as shown in FIG. 14A, for example, substrate 200 having copper foils (2001, 2002) on the first surface and the second surface is prepared. As for the starting material, copper-clad laminate may be used, for example. As shown in FIG. 14B, through-hole (200d) is formed by a drill or a laser, for example. PN plating (such as chemical copper plating and copper electroplating) is performed. In doing so, as shown in FIG. 14C, conductive films (2003, 2004) are formed on the first surface and second surface of substrate 200, and through-hole conductor (200c) is formed on the wall surface of through-hole (200d). Conductive films (2003, 2004) are composite films made by laminating copper foil and copper-plated coating.

Figure 14D:
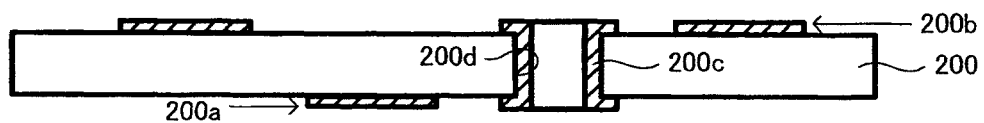
FIG. 14D is a view to illustrate a fourth step for forming a first wiring layer of the second rigid wiring board.

Conductive films (2003, 2004) are patterned by predetermined photo-etching procedures (acid cleansing, resist lamination, exposure and development, etching, film removal and so forth), for example. Accordingly, as shown in FIG. 14D, wiring layers (200a, 200b) (first wiring layers) are formed. Then, the second wiring layers are formed after an inspection step, a surface-roughening treatment and so forth.

Figure 15A:
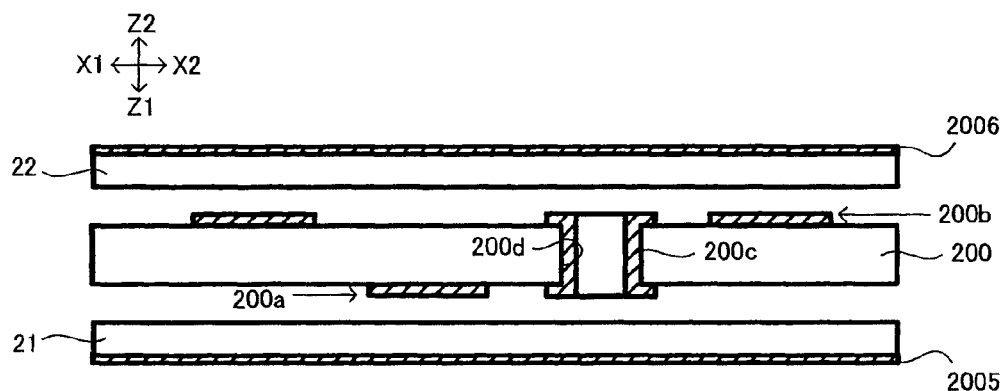
FIG. 15A is a view to illustrate a first step for forming a second wiring layer of the second rigid wiring board.

When forming the second wiring layers, as shown in FIG. 15A, for example, insulation layer 21 having copper foil 2005 is prepared, and insulation layer 22 having copper foil 2006 is prepared. Insulation layer 21 is arranged on the first-surface side of substrate 200, and insulation layer 22 is arranged on the second-surface side of substrate 200. Insulation layers (21, 22) are made of prepreg, for example.

Pressure on external-side copper foils (2005, 2006) is exerted using a hydraulic pressing apparatus, for example. In doing so, insulation layers (21, 22) are pressed, and insulation layers (21, 22) adhere to substrate 200.

Figure 15B:
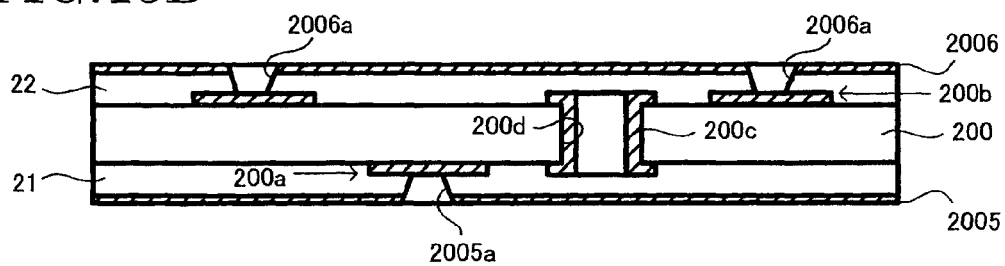
FIG. 15B is a view to illustrate a second step for forming a second wiring layer of the second rigid wiring board.
Figure 15C:
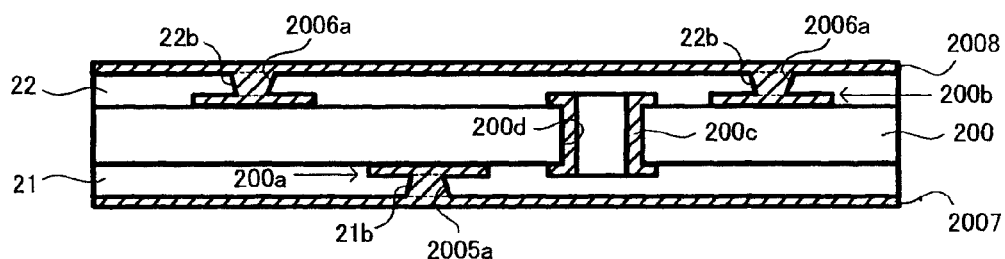
FIG. 15C is a view to illustrate a third step for forming a second wiring layer of the second rigid wiring board.

As shown in FIG. 15B, via hole (2005a) is formed in insulation layer 21, and via hole (2006a) in insulation layer 22 is formed using a laser, for example. After desmearing, PN plating (such as chemical copper plating and copper electroplating) is performed, for example. In doing so, as shown in FIG. 15C, conductive film 2007 is formed on the first surface of insulation layer 21, conductive film 2008 is formed on the second surface of insulation layer 22, interlayer connection conductor (21b) is formed in via hole (2005a), and interlayer connection conductor (22b) is formed in via hole (2006a). Conductive films (2007, 2008) are composite films made by laminating copper foil and copper-plated coating.

Figure 15D:
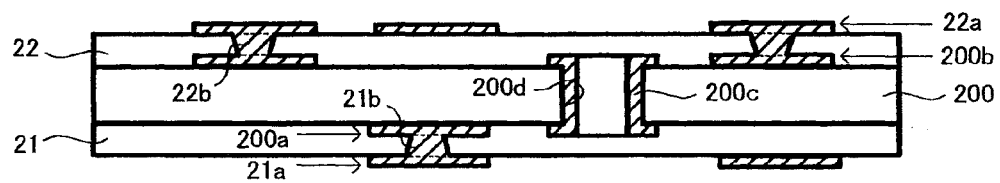
FIG. 15D is a view to illustrate a fourth step for forming a second wiring layer of the second rigid wiring board.

Conductive films (2007, 2008) are patterned by predetermined photo-etching procedures (acid cleansing, resist lamination, exposure and development, etching, film removal and so forth), for example. Accordingly, as shown in FIG. 15D, wiring layers (21a, 22a) (second wiring layers) are formed. Then, the third wiring layers are formed after an inspection step, a surface-roughening treatment and so forth.

Figure 16A:
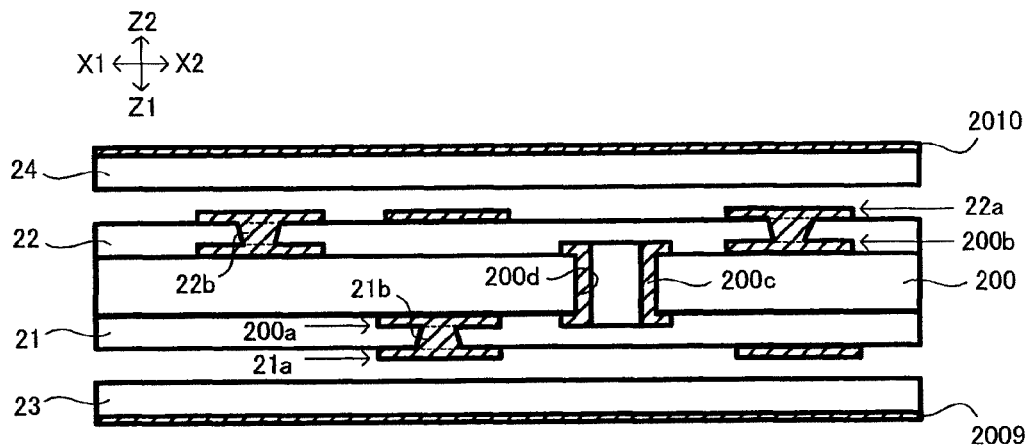
FIG. 16A is a view to illustrate a first step for forming a third wiring layer of the second rigid wiring board.

When forming the third wiring layers, as shown in FIG. 16A, for example, insulation layer 23 having copper foil 2009 is prepared, and insulation layer 24 having copper foil 2010 is prepared. Insulation layer 23 is arranged on the first-surface side of insulation layer 21, and insulation layer 24 on the second-surface side of insulation layer 22 is arranged. Insulation layers (23, 24) are made of prepreg, for example.

Pressure is exerted on external-side copper foils (2009, 2010) using a hydraulic pressing apparatus, for example. In doing so, insulation layers (23, 24) are pressed, insulation layer 21 and insulation layer 23 are adhered, and insulation layer 22 and insulation layer 24 are adhered.

Figure 16B:
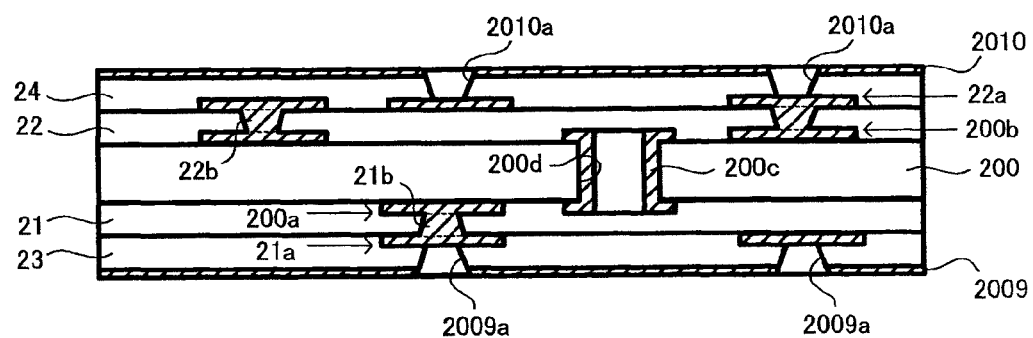
FIG. 16B is a view to illustrate a second step for forming a third wiring layer of the second rigid wiring board.
Figure 16C:
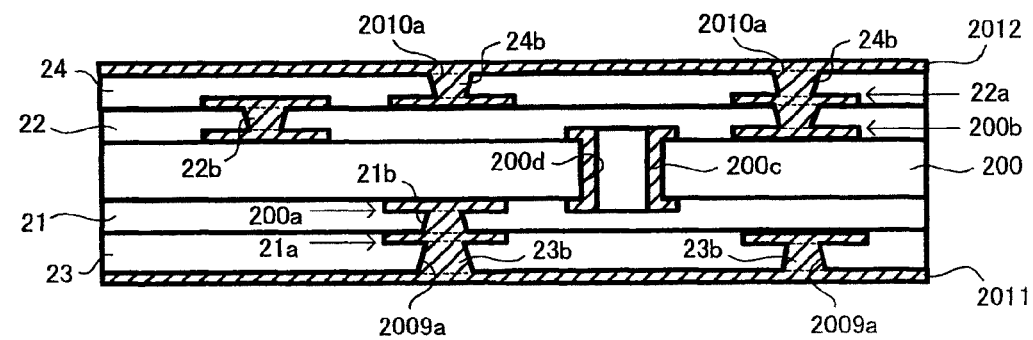
FIG. 16C is a view to illustrate a third step for forming a third wiring layer of the second rigid wiring board.

As shown in FIG. 16B, via hole (2009a) is formed in insulation layer 23, and via hole (2010a) is formed in insulation layer 24 using a laser, for example. After desmearing, PN plating (such as chemical copper plating and copper electroplating) is performed, for example. In doing so, as shown in FIG. 16C, conductive film 2011 is formed on the first surface of insulation layer 23, conductive film 2012 is formed on the second surface of insulation layer 24, interlayer connection conductor (23b) is formed in via hole (2009a), and interlayer connection conductor (24b) is formed in via hole (2010a).

Conductive films (2011, 2012) are composite films made by laminating copper foil and copper-plated coating.

Conductive films (2011, 2012) are patterned by predetermined photo-etching procedures (acid cleansing, resist lamination, exposure and development, etching, film removal and so forth), for example. Accordingly, as shown in FIG. 5A previously, wiring layers (23a, 24a) (third wiring layers) are formed.

The side surfaces of second rigid wiring board 20 are shaped to be zigzag, using a die or a laser, for example (see FIGS. 12A, 12B). Such a zigzag configuration is formed to correspond to the configuration of the wall surfaces of accommodation section (S1). The die used for forming second rigid wiring board 20 may be the same as or different from the die used for first rigid wiring board 10. However, in order to make a highly accurate fit for both boards, dies to be used exclusively for each of them are preferred to be prepared.

When forming the side surfaces of second rigid wiring board 20 in a zigzag configuration, alignment marks (for example, conductive patterns) that can be readable by X-rays are arranged in four corners of second rigid wiring board 20, and the configuration is preferred to be formed based on such alignment marks. Also, according to requirements, burrs on the cut surfaces may be removed.

By using a work-size wiring board (see FIG. 13) including multiple wiring boards, multiple second rigid wiring boards 20 may be manufactured at one time.

Through the steps so far, second rigid wiring board 20 (FIGS. 5A, 5B) is completed, which has conductors (wiring layers (21a) and others), whose side surfaces are zigzag, and whose external dimensions are smaller than those of first rigid wiring board 10.

Figure 17:
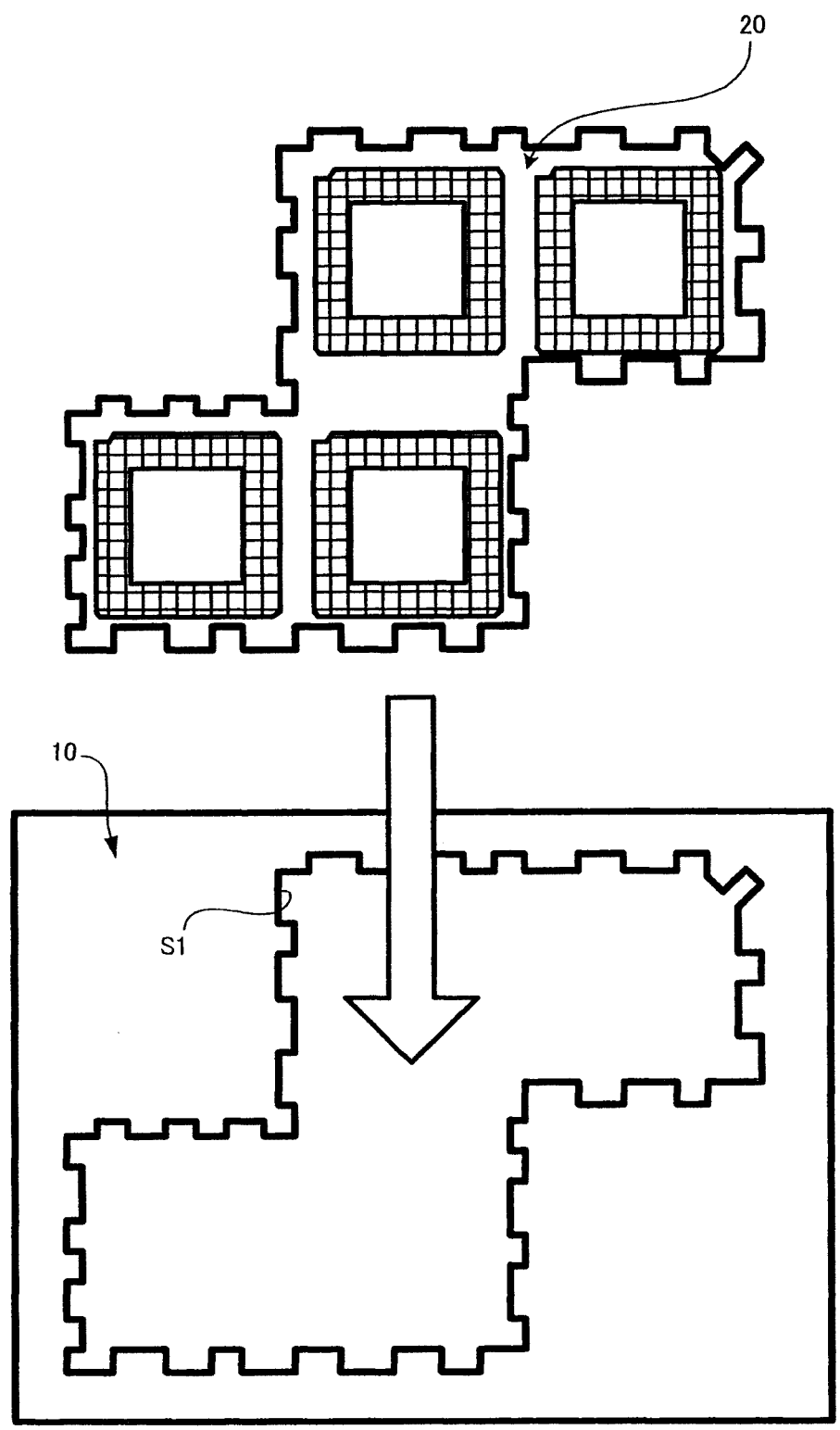
FIG. 17 is a view to illustrate a step for accommodating a second rigid wiring board in an accommodation section.

Second rigid wiring board 20 is accommodated in accommodation section (S1) of first rigid wiring board 10. More specifically, as shown in FIG. 17, second rigid wiring board 20 is fit into accommodation section (S1). By doing so, second rigid wiring board 20 fits with accommodation section (S1).

Figure 18A:
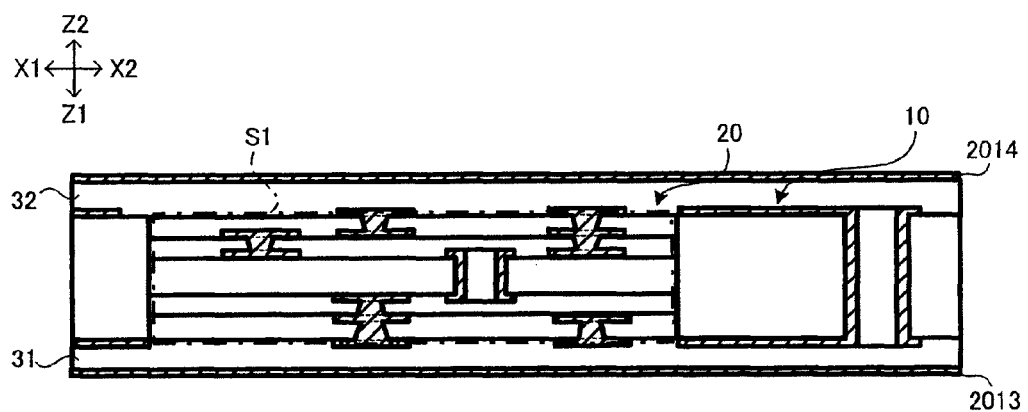
FIG. 18A is a view to illustrate a first step for forming insulation layers and wiring layers on both surfaces of a first rigid wiring board and a second rigid wiring board.

As shown in FIG. 18A, for example, insulation layer 31 having copper foil 2013 and insulation layer 32 having copper foil 2014 are arranged on both surfaces of first rigid wiring board 10 and second rigid wiring board 20. Then, using a hydraulic pressure apparatus, for example, pressure is exerted on the external-side copper foils (2013, 2014). In doing so, insulation layers (31, 32) are pressed, and first rigid wiring board 10 and second rigid wiring board 20 are adhered to insulation layers (31, 32) respectively. At that time, in case slight steps are formed between first rigid wiring board 10 and second rigid wiring board 20, a buffer material may be arranged beneath insulation layers (31, 32) to eliminate such steps. Insulation layers (31, 32) are made of prepreg, for example. In addition, as for buffer materials, resin film may be used, for example.

Figure 18B:
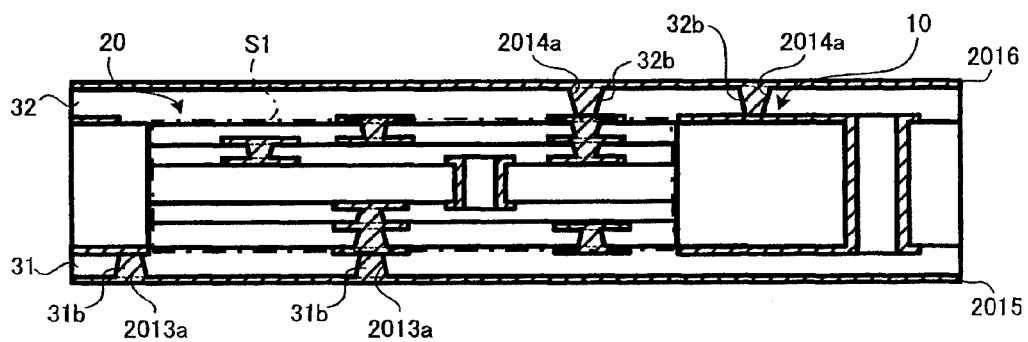
FIG. 18B is a view to illustrate a second step for forming insulation layers and wiring layers on both surfaces of a first rigid wiring board and a second rigid wiring board.

As shown in FIG. 18B, via hole (2013a) in insulation layer 31 and via hole (2014a) in insulation layer 32 are formed using a laser, for example. Furthermore, after desmearing, PN plating (such as chemical copper plating and copper electroplating) is performed, for example. In doing so, conductive film (2015) is formed on the first surface of insulation layer 31, conductive film (2016) is formed on the second surface of insulation layer 32, interlayer connection conductor (31b) is formed in via hole (2013a), and interlayer connection conductor (32b) is formed in via hole (2014a). Conductive films (2015, 2016) are composite films made by laminating copper foil and copper-plated coating.

Figure 18C:
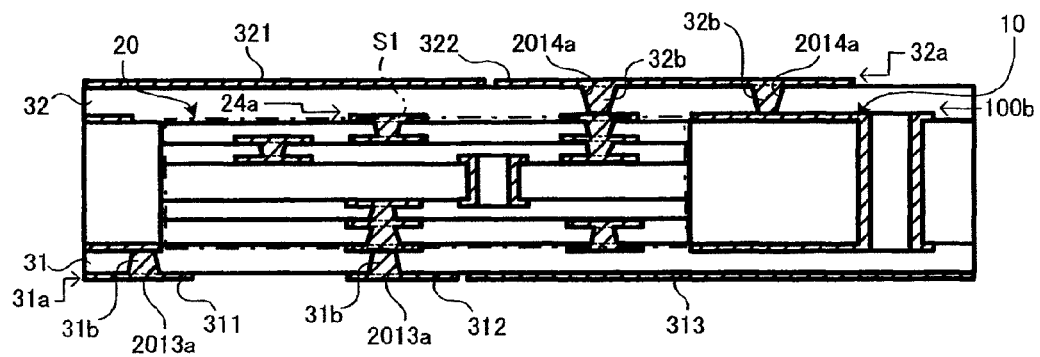
FIG. 18C is a view to illustrate a third step for forming insulation layers and wiring layers on both surfaces of a first rigid wiring board and a second rigid wiring board.

As shown in FIG. 18C, for example, conductive films (2015, 2016) are patterned by predetermined photo-etching procedures (acid cleansing, resist lamination, exposure and development, etching, film removal and so forth). In doing so, wiring layer (31a) including conductive patterns (311-313) and wiring layer (32a) including conductive patterns (321, 322) are formed. Then, wiring layer (100b) (conductor) on first rigid wiring board 10 and wiring layer (24a) (conductor) on second rigid wiring board 20 are electrically connected to each other by means of via hole (2014a) and conductive pattern 322 formed in regard to insulation layer 32.

Figure 19A:
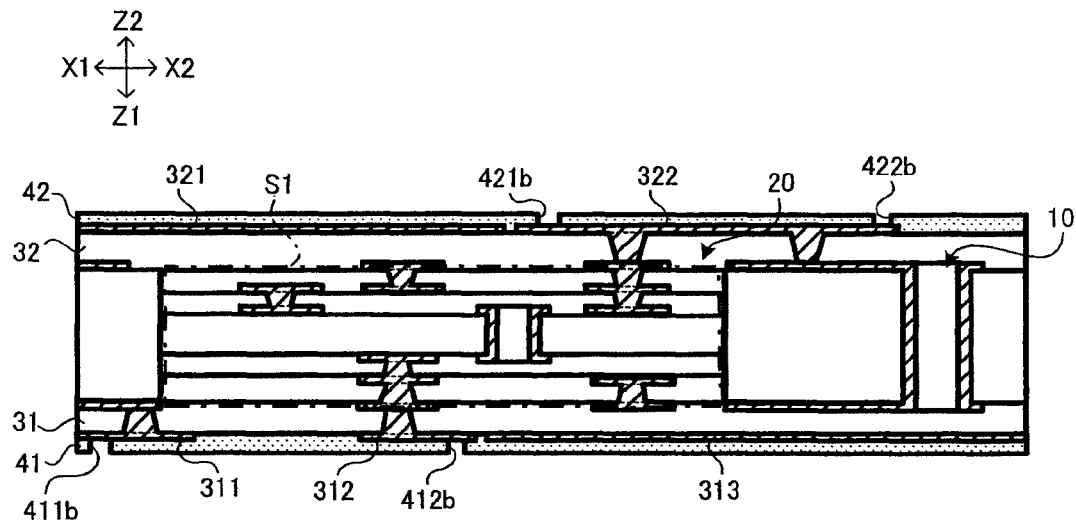
FIG. 19A is a view to illustrate a first step for forming external connection terminals.
Figure 19B:
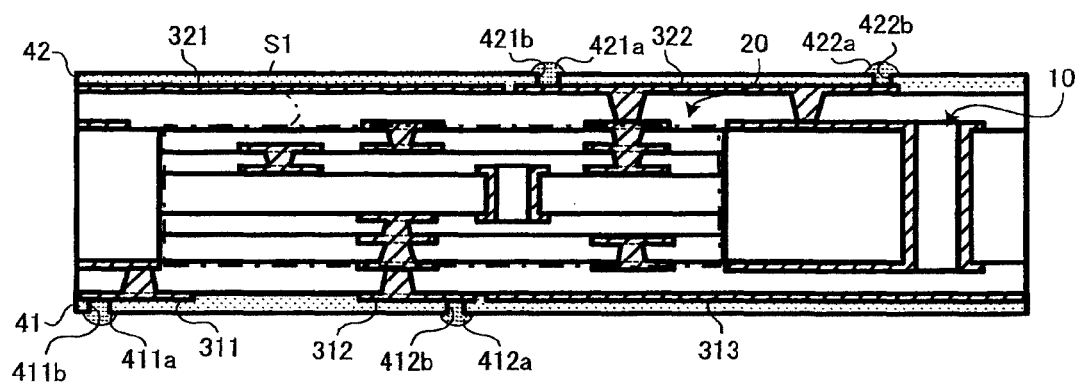
FIG. 19B is a view to illustrate a second step for forming external connection terminals.

As shown in FIG. 19A, for example, solder-resist layer 41 having opening portions (411b, 412b) is formed on insulation layer 31, and solder-resist layer 42 having opening portions (421b, 422b) is formed on insulation layer 32, using, for example, screen printing, spray coating, roll coating or the like. Accordingly, conductive pattern 311 is exposed through opening portion (411b), conductive pattern 312 is exposed in opening portion (412b), and conductive pattern 322 is exposed through opening portions (421b, 422b).

External connection terminals (411a, 412a, 421a, 422a) are formed in opening portions (411b, 412b, 421b, 422b). Such external connection terminals (411a, 412a, 421a, 422a) may be formed, for example, by applying solder paste and then curing it through a thermal treatment such as reflow or the like.

Through the steps above, wiring board 1000 (FIGS. 1 and 2) is completed, which has first rigid wiring board 10, second rigid wiring board 20, and insulation layers (31, 32) formed on first rigid wiring board 10 and second rigid wiring board 20, and in which second rigid wiring board 20 is accommodated in accommodation section (S1), and conductors of first rigid wiring board 10 and conductors of second rigid wiring board 20 are electrically connected to each other.

According to a manufacturing method of the present embodiment, by manufacturing second rigid wiring board 20 with smaller external dimensions to be highly integrated, productivity will increase.

In the manufacturing method of the present embodiment, second rigid wiring board 20 with high-density wiring formed through complex steps is manufactured separately from first rigid wiring board 10. Thus, by inspecting, for example, in a step prior to accommodating second rigid wiring board 20 in first rigid wiring board 10, only a good unit is accommodated in first rigid wiring board 10. Accordingly, yield rates of wiring boards 1000 may be improved.

So far, a wiring board and its manufacturing method according to an embodiment of the present invention have been described. However, the present invention is not limited to the above embodiment. For example, the present invention may be carried out by being modified as follows.

Figure 20:
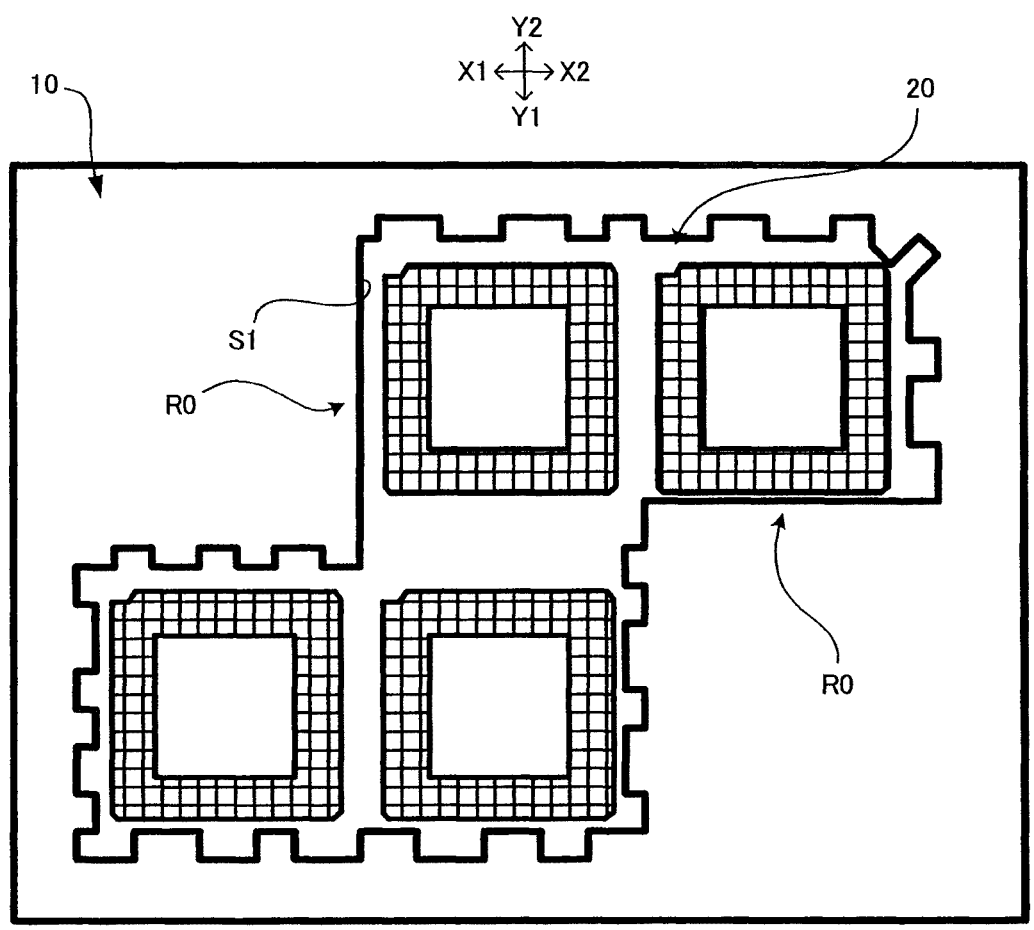
FIG. 20 is a view showing a first alternative example of a wiring board.

To suppress cracks or the like, the side surfaces of second rigid wiring board 20 and the wall surfaces of accommodation section (S1) are preferred to have a concave-convex configuration on their entire circumference, but those surfaces are not limited to such. For example, as shown in FIG. 20, even if straight region (R0) is included partially, effects to a certain degree may be expected. However, in such a case as well, it is preferred that a region of 50% or more of the entire circumference of second rigid wiring board 20 be shaped zigzag.

Figure 21:
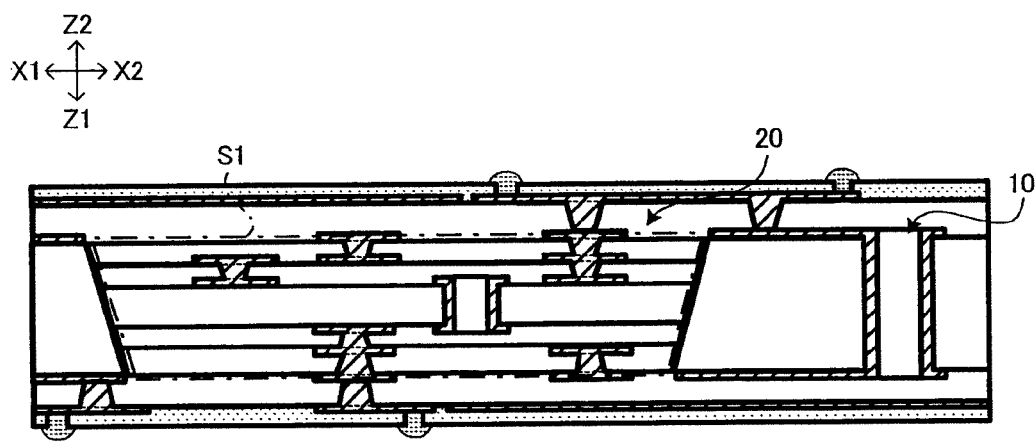
FIG. 21 is a view showing a second alternative example of a wiring board.

The side surfaces of second rigid wiring board 20 and the wall surfaces of accommodation section (S1) are not limited to being perpendicular to the main surfaces (FIG. 1). For example, as shown in FIG. 21, the surfaces may be tapered.

Figure 22:
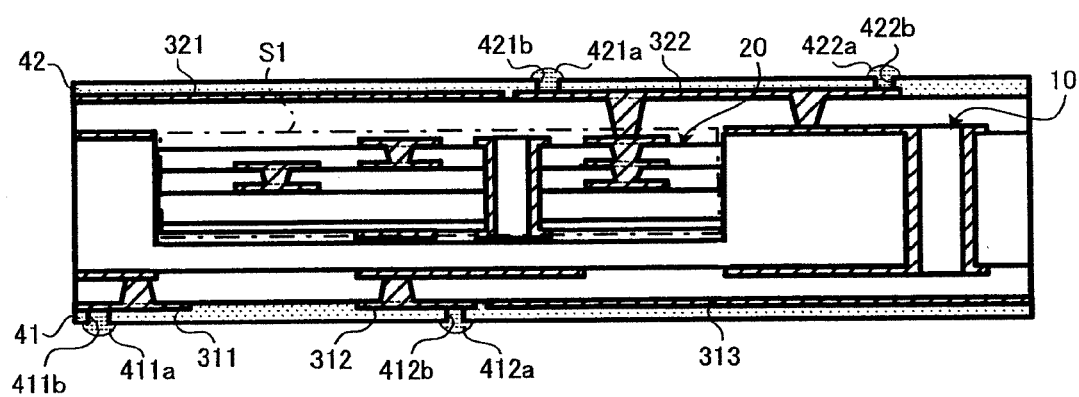
FIG. 22 is a view showing a third alternative example of a wiring board.

Accommodation section (S1) is not limited to a penetrating hole (FIG. 1). For example, as shown in FIG. 22, it may be a cavity. However, to make manufacturing a wiring board easier, and to accommodate further multilayered second rigid wiring board 20 in accommodation section (S1), accommodation section (S1) is preferred to be a penetrating hole.

Figure 23:
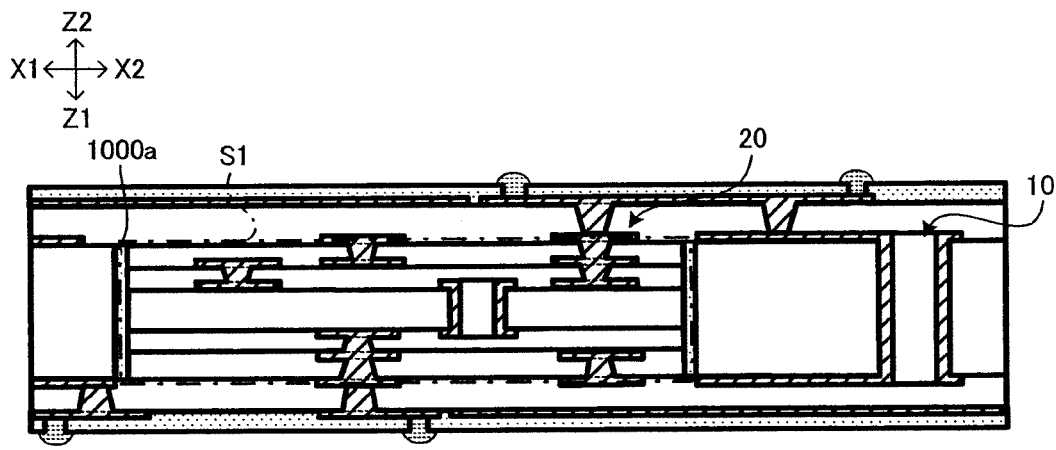
FIG. 23 is a view showing a fourth alternative example of a wiring board.

In the above embodiment, second rigid wiring board 20 fits with accommodation section (S1). However, the present invention is not limited to such. For example, as shown in FIG. 23, predetermined clearance may exist between the side surfaces of second rigid wiring board 20 and the wall surfaces of accommodation section (S1). In such a case, resin (1000a) contained, for example, in insulation layer 31 or 32, is preferred to be filled in gaps between second rigid wiring board 20 and accommodation section (S1). In doing so, second rigid wiring board 20 may be secured. In addition, impact on second rigid wiring board 20 may be mitigated. Resin (1000a) may be filled in gaps between second rigid wiring board 20 and accommodation section (S1) by being squeezed out from insulation layer 31 or 32. However, because of a risk of positional shifting, second rigid wiring board 20 is preferred to be fixed prior to filling resin (1000a), using an adhesive agent or the like.

Other than those above, the structures of first rigid wiring board 10 and second rigid wiring board 20 may be modified within a scope that does not deviate from the gist of the present invention.

Figure 24:
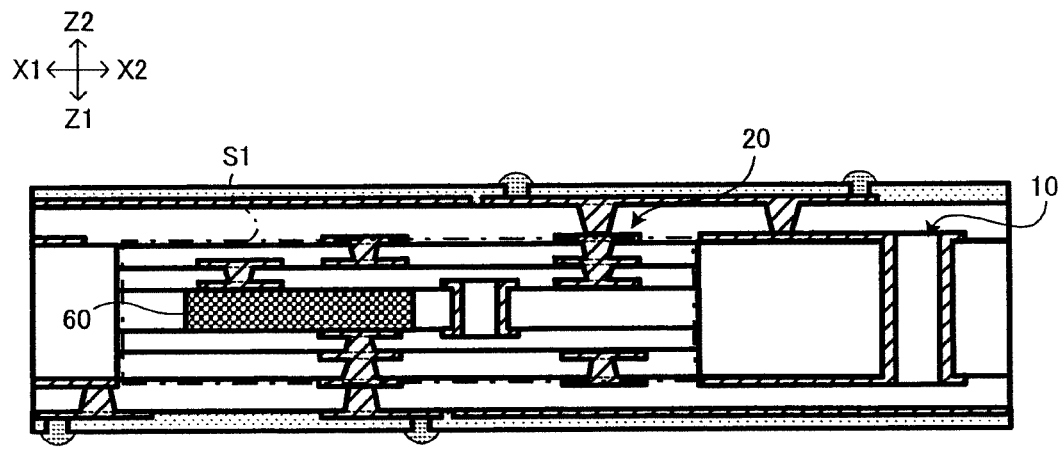
FIG. 24 is a view showing a fifth alternative example of a wiring board.

As shown in FIG. 24, for example, second rigid wiring board 20 may be a wiring board with built-in electronic component 60.

Figure 25:
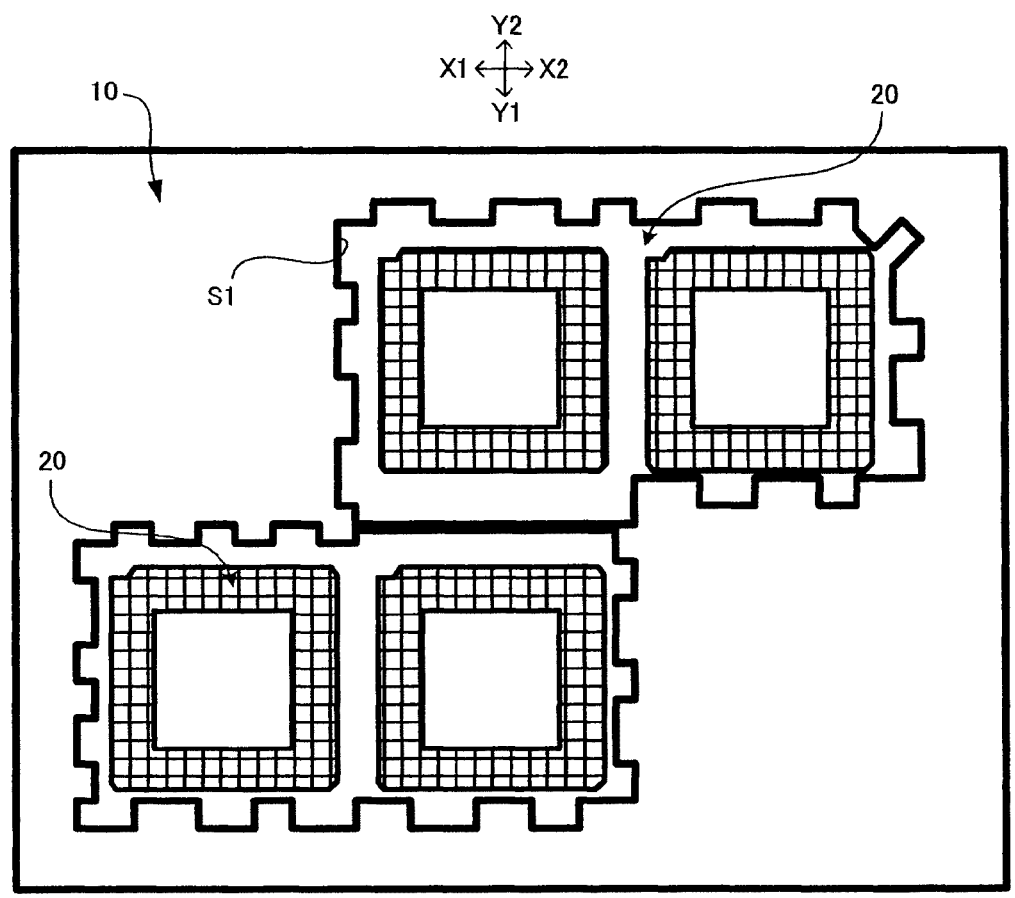
FIG. 25 is a view showing a sixth alternative example of a wiring board.

The number of second rigid wiring boards 20 to be accommodated in accommodation section (S1) is not limited to any specific number. For example, as shown in FIG. 25, multiple (such as two) second rigid wiring boards 20 may be accommodated in accommodation section (S1).

The method for connecting first rigid wiring board 10 and second rigid wiring board 20 is not limited specifically. For example, they may be connected by wire bonding, flip-chip bonding or the like.

First rigid wiring board 10 and second rigid wiring board 20 may be single-sided wiring boards having conductors (wiring layers) only on either the upper or the lower surface of a core.

Figure 26:
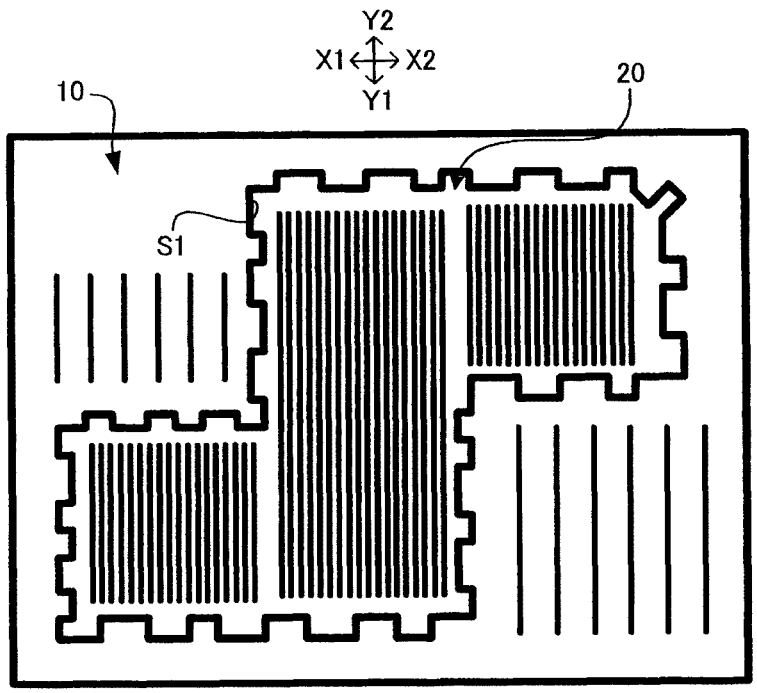
FIG. 26 is a view showing a seventh alternative example of a wiring board.

In the above embodiment, the number of wiring layers included in the same thickness is greater in second rigid wiring board 20 than in first rigid wiring board 10. However, the present invention is not limited to such, and may have any number of wiring layers. The density of existing conductors included in second rigid wiring board 20, however, is preferred to be higher than the density of existing conductors included in first rigid wiring board 10. Accordingly, when the number of wiring layers in first rigid wiring board 10 is the same as the number of wiring layers in second rigid wiring board 20, as shown in FIG. 26, for example, the density of wiring patterns is preferred to be higher in second rigid wiring board 20 than in first rigid wiring board 10.

Figure 27:
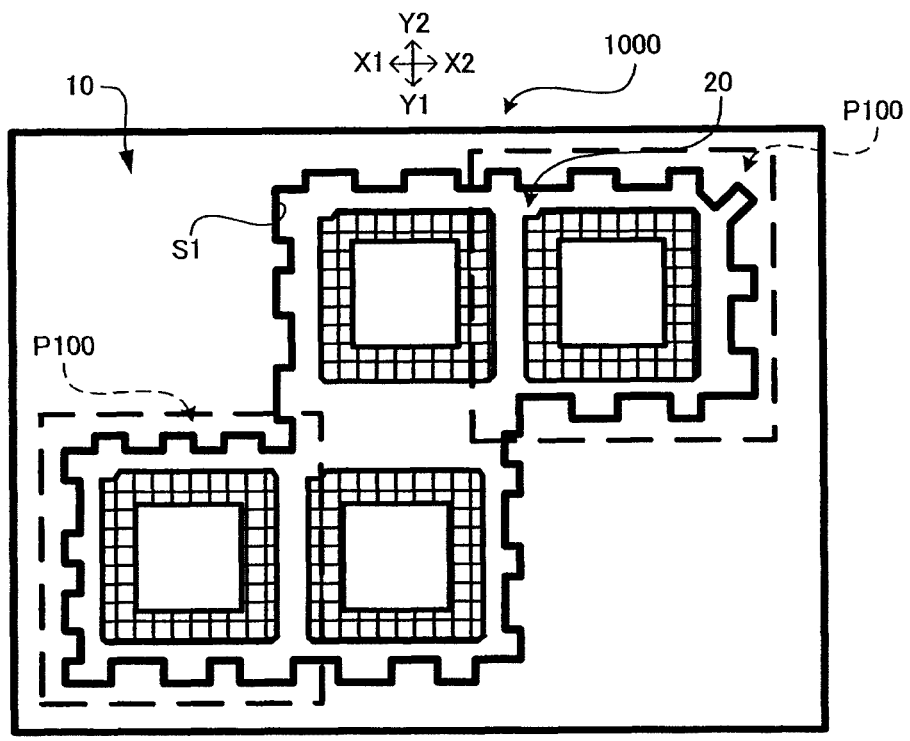
FIG. 27 is a view showing an eighth alternative example of a wiring board.

Insulation layers (31, 32) and solder-resist layers (41, 42) may be formed either on the entire surface or part of the surface of wiring board 1000. For example, as shown in FIG. 27, insulation layers (31, 32) and solder-resist layers (41, 42) (see FIG. 1) may be formed only in predetermined region (R100). In such a case as well, insulation layers (31, 32) are formed on first rigid wiring board 10 and second rigid wiring board 20.

Figure 28A:
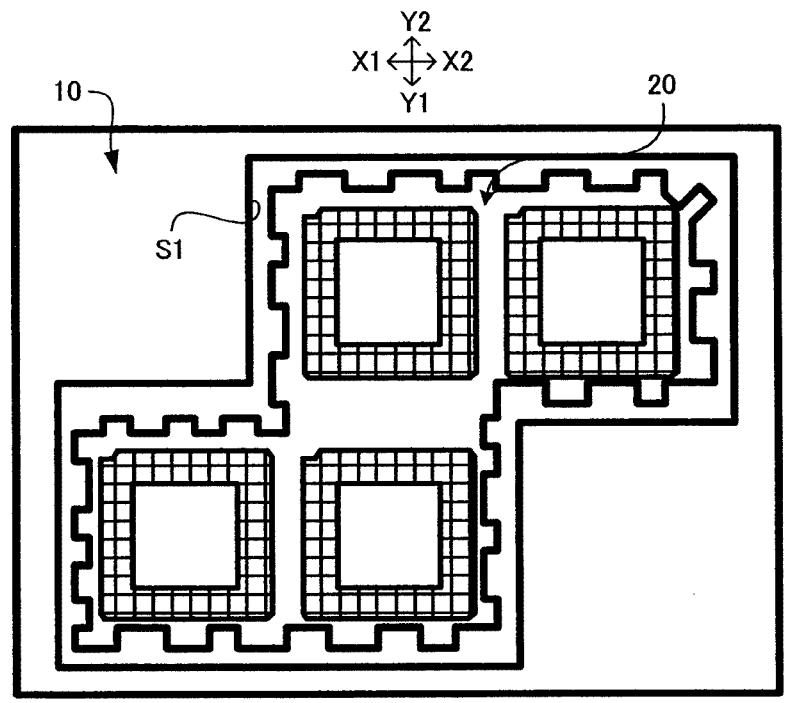
FIG. 28A is a view showing a ninth alternative example of a wiring board.
Figure 28B:
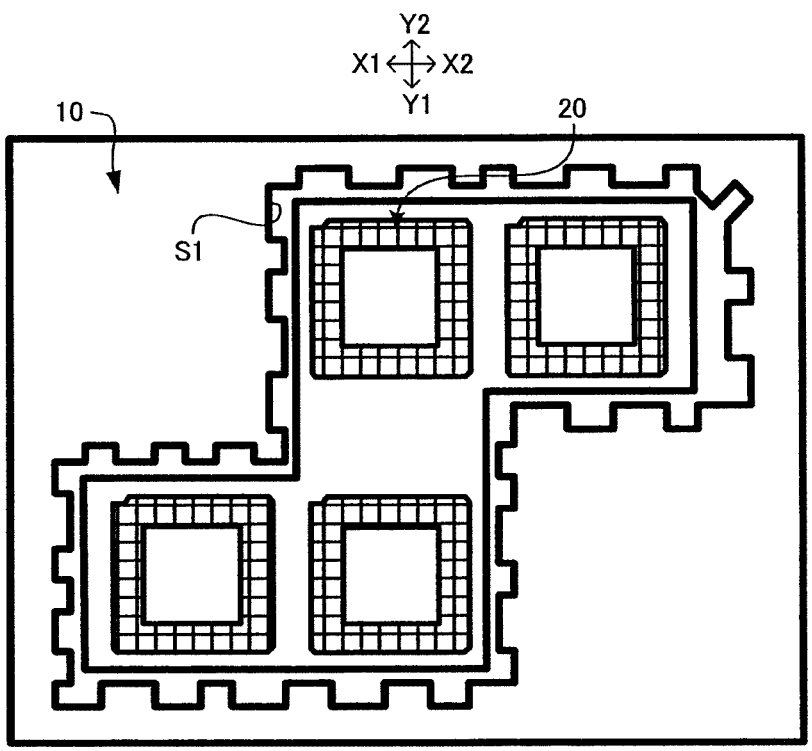
FIG. 28B is a view showing a tenth alternative example of a wiring board.

The wall surfaces of accommodation section (S1) facing the side surfaces of second rigid wiring board 20 are preferred to have a concave-convex configuration corresponding to the concave-convex configuration on the side surfaces of second rigid wiring board 20. However, the present invention is not limited to such. For example, as shown in FIG. 28A, only the side surfaces of second rigid wiring board 20 may be shaped zigzag, and the wall surfaces of accommodation section (S1) may be shaped straight. Alternatively, as shown in FIG. 28B, only the wall surfaces of accommodation section (S1) may be shaped zigzag and the side surfaces of second rigid wiring board 20 may be shaped straight.

Figure 29:
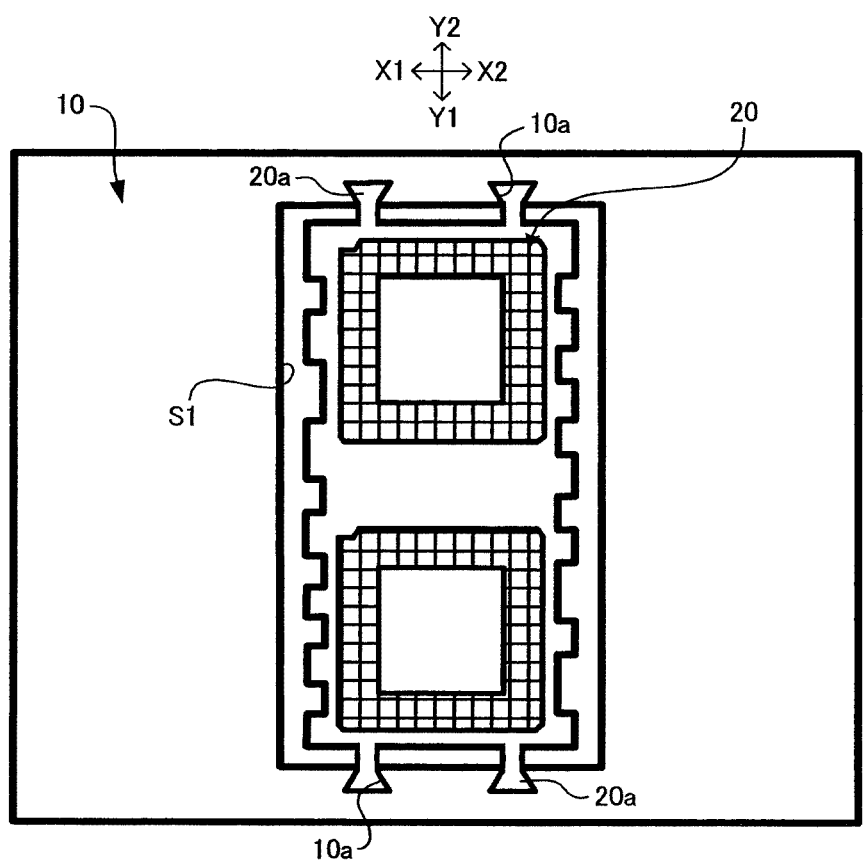
FIG. 29 is a view showing an eleventh alternative example of a wiring board.

As shown in FIG. 29, claw receptor (10a) is formed in first rigid wiring board 10, and lock claw (20a) is formed in second rigid wiring board 20. First rigid wiring board 10 and second rigid wiring board 20 may be connected by fitting lock claw (20a) with claw receptor (10a). Lock claw (20a) has a trapezoidal shape, widening from second rigid wiring board 20 toward first rigid wiring board 10. Claw receptor (10a) is a cavity to fit with lock claw (20a). However, they are not limited to such. Lock claw (20a) and its claw receptor (10a) may be employed in any configuration. Moreover, the lock claw (protruding portion) may be formed in first rigid wiring board 10, and its claw receptor (recessed portion) may be formed in second rigid wiring board 20.

The contents and the order of the steps in the above embodiment may be modified freely within a scope that does not deviate from the gist of the present invention. Also, unnecessary steps may be omitted according to usage requirements or the like.

Figure 30:
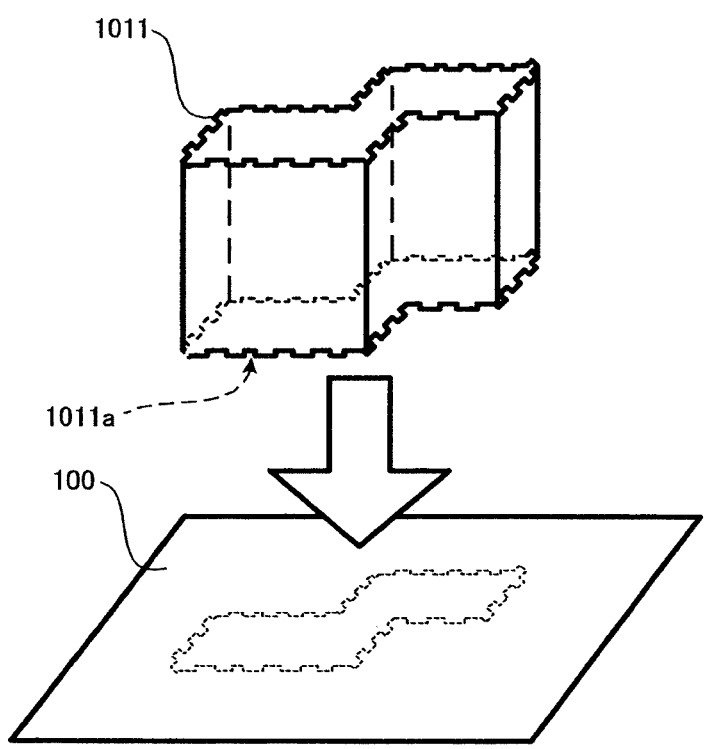
FIG. 30 is a view showing another example of a method for manufacturing a wiring board.

Instead of the quadrilateral cylindrical shape of die 1011 (FIG. 12A), accommodation section (S1) may be formed using die 1011 which is shaped to have two quadrilateral cylinders joined by shifting from each other as shown in FIG. 30, for example. In such a case, by pressurizing die 1011 once, accommodation section (S1) corresponding to the shape of opening surface (1011a) may be formed in a substrate (FIG. 11D).

In the present embodiment, wiring layers (21a) and others are formed by a subtractive method (a method for patterning by etching). However, instead of a subtractive method, a semi-additive (SAP) method may be employed. In a semi-additive method, after the entire surfaces of an insulative substrate are made conductive by electroless plated film (panel plating), a resist is formed and electrolytic plating is performed in areas without the resist. Then, after the resist is removed, electroless plated film is patterned by etching.

Obviously, numerous modifications and variations of the present invention are possible in light of the above teachings. It is therefore to be understood that within the scope of the appended claims, the invention may be practiced otherwise than as specifically described herein.

What is claimed is:
1. A wiring board comprising:
a first rigid wiring board including a first conductor and having an accommodation portion;
a second rigid wiring board accommodated in the accommodation portion of the first rigid wiring board and including a second conductor electrically connected to the first conductor of the first rigid wiring board;
a first insulation layer formed on a top surface of the first rigid wiring board and a top surface of the second rigid wiring board; and
a second insulation layer formed on a bottom surface of the first rigid wiring board and a bottom surface of the second rigid wiring board,
wherein the accommodation portion of the first rigid wiring board has a plurality of wall surfaces tapering in a continuous line from the top surface of the first rigid wiring board to the bottom surface of the first rigid wiring board on an opposite side of the top surface, and the second rigid wiring board has a plurality of side surfaces tapering in a continuous line such that the side surfaces of the second rigid wiring board substantially fit into the wall surfaces of the accommodation portion of the first rigid wiring board.

2. The wiring board according to claim 1, wherein the accommodation portion of the first rigid wiring board has the wall surfaces tapering from the top surface to the bottom surface of the first rigid wiring board around substantially an entire circumference of the accommodation portion of the first rigid wiring board.

3. The wiring board according to claim 1, wherein the side surfaces of the second rigid wiring board and the wall surfaces of the accommodation portion form a space between the first rigid wiring board and the second rigid wiring board, and the space between the first rigid wiring board and the second rigid wiring board is filled with a resin.

4. The wiring board according to claim 1, wherein the first conductor of the first rigid wiring board and the second conductor of the second rigid wiring board are electrically connected to each other by a plurality of via holes formed in the insulation layer.

5. The wiring board according to claim 1, wherein the second conductor of the second rigid wiring board comprises a plurality of conductor layers formed in the second rigid wiring board, and the second rigid wiring board has more conductor layers than the first rigid wiring board.

6. The wiring board according to claim 1, further comprising:
a first external connection terminal formed in a region directly on the first rigid wiring board; and
a second external connection terminal formed in a region directly on the second rigid wiring board.

7. The wiring board according to claim 1, wherein at least one of the plurality of wall surfaces of the first rigid wiring board and the plurality of side surfaces of the second rigid wiring board has a concave-convex portion.

8. The wiring board according to claim 1, wherein the plurality of side surfaces of the second rigid wiring board has a concave-convex portion, and the plurality of wall surfaces of the accommodation portion facing the plurality of side surfaces of the second rigid wiring board has a concave-convex portion corresponding to the concave-convex portion on the side surfaces of the second rigid wiring board.

9. The wiring board according to claim 1, further comprising a metal film having a solid pattern formed directly on a boundary portion between the wall surfaces of the accommodation portion and the side surfaces of the second rigid wiring board.

10. The wiring board of claim 1, wherein the second conductor includes a top conductor on the top surface of the second rigid wiring board and a bottom conductor on the bottom surface of the second rigid wiring board.

11. A method for manufacturing a wiring board, comprising: forming a first rigid wiring board including a first conductor and having an accommodation portion having a plurality of wall surfaces tapering in a continuous line from a top surface of the first rigid wiring board to a bottom surface on an opposite side of the top surface; forming a second rigid wiring board including a second conductor and having a plurality of side surfaces tapering in a continuous line such that the side surfaces of the second rigid wiring board substantially fit into the wall surfaces of the accommodation portion of the first rigid wiring board; accommodating the second rigid wiring board in the accommodation portion; forming a first insulation layer on the top surface of the first rigid wiring board and a top surface of the second rigid wiring board; forming a second insulation layer on the bottom surface of the first rigid wiring board and a bottom surface of the second rigid wiring board; and electrically connecting the conductor of the first rigid wiring board and the conductor of the second rigid wiring board to each other.

12. The method for manufacturing a wiring board according to claim 11, wherein the forming of the second rigid wiring board comprises forming a concave-convex portion on the side surfaces of the second rigid wiring board using a laser.

13. The method for manufacturing a wiring board according to claim 11, wherein the forming of the second rigid wiring board comprises forming a concave-convex portion on the side surfaces of the second rigid wiring board using a die.

14. The method for manufacturing a wiring board according to claim 11, wherein the forming of the first rigid wiring board comprises forming a concave-convex portion on the wall surfaces of the accommodation portion using a laser.

15. The method for manufacturing a wiring board according to claim 11, wherein the forming of the first rigid wiring board comprises forming a concave-convex portion on the wall surfaces of the accommodation portion using a die.

16. The method for manufacturing a wiring board according to claim 11, wherein the accommodating of the second rigid wiring board comprises fitting the second rigid wiring board within the accommodation portion.

* * * * *